US006575177B1

(12) United States Patent
Brown et al.

(10) Patent No.: US 6,575,177 B1
(45) Date of Patent: Jun. 10, 2003

(54) SEMICONDUCTOR SUBSTRATE CLEANING SYSTEM

(75) Inventors: Brian J Brown, Palo Alto, CA (US); Anwar Husain, Pleasanton, CA (US); Fred C Redeker, Fremont, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 09/558,815

(22) Filed: Apr. 26, 2000

Related U.S. Application Data

(60) Provisional application No. 60/131,124, filed on Apr. 27, 1999, and provisional application No. 60/143,230, filed on Jul. 10, 1999.

(51) Int. Cl.⁷ .............................. B08B 3/00; B08B 7/04
(52) U.S. Cl. ............................ 134/76; 134/77; 134/83; 134/902; 15/77; 15/88.3; 15/102
(58) Field of Search ..................... 134/76, 77, 82, 134/83, 902; 15/77, 88.3, 97.1, 102

(56) References Cited

U.S. PATENT DOCUMENTS

| 2,789,569 | A | * | 4/1957 | Davis ........................ 104/127 |
| 4,932,427 | A | * | 6/1990 | Yamada et al. ............. 118/423 |
| 5,014,726 | A | * | 5/1991 | Lindvall ..................... 118/423 |
| 5,317,778 | A | | 6/1994 | Kudo et al. |
| 5,822,213 | A | | 10/1998 | Huynh |
| 5,853,483 | A | | 12/1998 | Morita et al. |
| 5,950,643 | A | * | 9/1999 | Miyazaki et al. ........... 134/201 |
| 6,007,675 | A | * | 12/1999 | Toshima ..................... 118/716 |
| 6,082,377 | A | | 7/2000 | Frey |
| 6,345,635 | B2 | * | 2/2002 | Lachmann et al. ........... 134/76 |

FOREIGN PATENT DOCUMENTS

EP          0 854 499 A2    7/1998

* cited by examiner

Primary Examiner—Alexander Markoff
(74) Attorney, Agent, or Firm—Dugan & Dugan

(57) ABSTRACT

A modular semiconductor substrate cleaning system is provided that processes vertically oriented semiconductor substrates. The system features a plurality of cleaning modules that may include a megasonic tank-type cleaner followed by a scrubber. An input module may receive a horizontally oriented substrate and rotate the substrate to a vertical orientation, and an output module may receive a vertically oriented substrate and rotate the substrate to a horizontal orientation. Each of the modules (input, cleaning and output) has a substrate support and may be positioned such that the substrate supports of adjacent modules are equally spaced. The modules are coupled by an overhead transfer mechanism having a plurality of substrate handlers spaced the same distance (X) as the substrate supports of the modules therebelow. The transfer mechanism indexes forward and backward the distance X to simultaneously transport semiconductor substrates through the cleaning system, lifting and lowering substrates from the desired modules wafer rotation/ orientation sensors, an input module cart for transporting wafers between a substrate handler of a previous tool (such as a semiconductor substrate polisher) and a substrate handler of the cleaning system are also included.

17 Claims, 21 Drawing Sheets

SEMICONDUCTOR SUBSTRATE CLEANING SYSTEM

This application claims priority from U.S. provisional application Serial Nos. 60/131,124 filed Apr. 27, 1999 and 60/143,230 filed Jul. 10, 1999.

BACKGROUND OF THE INVENTION

Currently available semiconductor substrate cleaning equipment suffers from high cost per unit substrate cleaned, unreliable removal of large flat particles, and of particles located along the beveled edge of a semiconductor substrate, lack of scalability and inability to easily adapt to various processing sequences, or to changes (e.g., increases) in semiconductor substrate size. Among the many factors that contribute to substrate cleaning costs, the capital cost of substrate handlers which move semiconductor substrates between various locations presents a significant expense. Another significant expense arises because semiconductor substrate cleaning processes are performed within a clean room environment. The larger the area occupied by the cleaning system (i.e., the larger the footprint) the more expensive the cleaning system is to operate, due to the high cost of clean room area.

Unreliable cleaning, however, increases cleaning costs more than any other factor. As semiconductor substrates increase in size, failures become more expensive, and as devices formed on semiconductor substrates decrease in size, particles are more likely to cause failures.

Accordingly, improvements are needed in the field of semiconductor substrate cleaning.

SUMMARY OF THE INVENTION

An inventive semiconductor substrate cleaning system comprises a plurality of cleaning modules, each module has a substrate support for supporting a vertically oriented semiconductor substrate during a cleaning process, and each module is positioned such that the substrate supports thereof are spaced a fixed distance X. An input module positioned adjacent a first end module of the plurality of cleaning modules has a substrate support positioned a distance X from the substrate support of the first end module, and an output module positioned adjacent a second end module of the plurality of cleaning modules has a substrate support positioned the distance X from the substrate support of the second end module. A semiconductor substrate transfer mechanism having a plurality of substrate handlers spaced the distance X is movably coupled above the plurality of cleaning modules and above the input and output modules so as to move forward and backward the distance X, thereby simultaneously carrying semiconductor substrates between adjacent ones of the input module, the cleaning modules and the output module.

For cases where the substrates are not loaded vertically into the input module and/or are not unloaded vertically from the output module, the input and/or output modules may respectively include a mechanism for receiving a semiconductor substrate in a horizontal orientation and for rotating the semiconductor substrate to a vertical orientation and a mechanism for receiving a semiconductor substrate in a vertical orientation and for rotating the semiconductor substrate to a horizontal orientation. Likewise, to facilitate wafer handling, the input module may orient the substrate to place the substrate's flat in a known position (i.e., flat finding) such that the wafer handler will not contact the flat. In steady state operation, semiconductor substrates may be loaded to and unloaded from the system, are appropriately oriented horizontally or vertically and/or have their flats appropriately positioned while other substrates are being cleaned. System productivity therefore may be enhanced as the system need not idle during the time required for substrate load/unload and orient operations.

After semiconductor substrates are loaded to and unloaded from the system via the input module and the output module, the overhead transfer mechanism lowers the wafer handlers. In one aspect the wafer handlers are simultaneously lowered into the input module and the various cleaning modules to pick up or "grip" semiconductor substrates contained therein. Thereafter, by simply raising, indexing forward the distance X and lowering, the transfer mechanism simultaneously transfers a plurality of single substrate batches from one module to the next. The transfer mechanism ungrips the substrates, raises and returns to the home position while substrates are loaded/unloaded and oriented in the input and output modules. This process repeats until each substrate receives the desired processing and is unloaded. In this aspect, the simplicity of the simultaneous substrate transfer mechanism provides accurate yet cost effective substrate transfer.

The entirely vertical orientation of the cleaning modules requires minimal footprint, and enables the inventive cleaning system to be easily scaled. To accommodate changes in substrate size the substrate supports and wafer handlers may be adjustable. Thus, few alterations are required for changeover between cleaning substrates of differing size.

Other inventive aspects of the cleaning system comprise, in one aspect the use of a megasonic tank cleaner, followed by a scrubber, and in another aspect the design of a cleaning system which does not employ a scrubber.

Further features and advantages of the present invention will become more fully apparent from the following detailed description of the preferred embodiments, the appended claims and the accompanying drawings.

DETAILED DESCRIPTION OF THE PREFERRED EMBODIMENTS

Figure 1A:
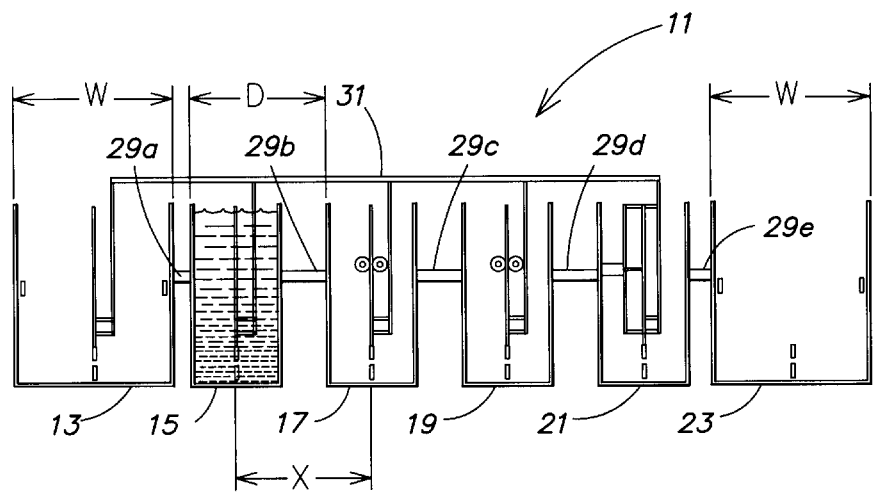
FIGS. 1A–F are schematic side elevational views of an inventive cleaning system.

FIGS. 1A–F are schematic side elevational views of an aspect of an inventive cleaning system 11 having an input module and an output module that rotate a substrate between horizontal and vertical positions. The inventive cleaning system 11 comprises a load module 13, a plurality of cleaning modules configured to support a semiconductor substrate in a vertical orientation, specifically a megasonic cleaner 15, a first scrubber 17, a second scrubber 19, and a spin-rinse-dryer 21; and an unload module 23. The megasonic cleaner 15 may be configured as described in U.S. patent application Ser. No. 09/191,057, filed Nov. 11, 1998 (AMAT No. 2909/CMP/RKK). The first scrubber 17 and the second scrubber 19 may be configured as described in U.S. patent application Ser. No. 09/113,447, filed Jul. 10, 1998 (AMAT No. 2401/CMP/RKK). The spin-rinse-dryer 21 may be configured as described in U.S. patent application Ser. No. 09/544,660, filed Apr. 6, 2000 (AMAT No. 3437/CMP/RKK) and the substrate transfer mechanism described below may be configured as described in U.S. patent application Ser. No. 09/300,562, filed Apr. 27, 1999 (AMAT No. 3375/CMP/RKK). The entire disclosure of each of the above identified applications is incorporated herein by this reference. It will be apparent that the apparatuses disclosed in the applications incorporated above are merely exemplary and other apparatuses may also be employed.

Each of the modules 13–23 has a substrate support 25*a–f,* respectively, for supporting a semiconductor substrate in a vertical orientation. It will be understood that the substrate supports 25*b–e* may be configured like the substrate supports described in the previously incorporated U.S. Patent Applications. The exemplary load module 13 is configured to receive a horizontally oriented semiconductor substrate and to rotate the semiconductor substrate to a vertical orientation. Similarly, the exemplary unload module 23 is configured to receive a vertically oriented semiconductor substrate and to rotate the semiconductor substrate to a horizontal orientation. To perform such substrate reorientation the substrate supports 25*a,* 25*f,* of the load module 13 and the unload module 23 are preferably operatively coupled to a rotation mechanism 27*a,* 27*b,* respectively, such as a motorized hinge.

Each of the modules may include an alignment and latching mechanism 29*a–e* for securing to adjacent modules so as to hold the modules in a predetermined position relative to each other. When in this predetermined position the substrate supports 25*a–f* may be equally spaced by a distance X (FIG. 1A). To facilitate this equal spacing, the cleaning modules 15–21 each have a length which is less than a distance X. Accordingly, the cleaning system 11 may be easily reconfigured to perform a number of different cleaning sequences. By unlatching the latching mechanisms 29*a–f* a module may be easily removed, replaced or reconfigured (i.e., the modules are "removably coupled").

The latching mechanisms 29*a–e* are adjustable to allow a cleaning module 15–21 to be either coupled closely adjacent a load/unload module 13, 23, or to allow a cleaning module 15–21 to be coupled to an adjacent cleaning module 15–21 in a spaced relationship such that the overall distance D (FIG. 1A) between the wafer position in the first cleaning module and the wafer position in the next adjacent cleaning module is equal to a fixed distance (FIG. 1A). In this manner, each of the substrate supports 25*a–e* may be equally spaced the distance X (FIG. 1A) from the adjacent substrate supports 25 on either side thereof, provided all modules have an overall width $W_n$ less than or equal to the distance X. Further, although the wafer position within any module need not be centered between the front and back face of the module, the distance between the wafer and the front face of the module and the distance between the wafer and the back face of the module may be less than or equal to one-half of X (the distance between adjacent wafer supports) so as to preserve configurability.

A substrate transfer mechanism 31 having a plurality of substrate handlers 33*a–e* is operatively coupled above the plurality of modules 13–23. In this example, the substrate handlers 33*a–e* are spaced by the distance X (FIG. 1A) and are equal in number to the number (n) of modules 13–23 in a given cleaning system configuration, minus one (n−1). The substrate transfer mechanism 31 is coupled so as to move the distance X (FIG. 1A), from a "load" position wherein the first substrate handler 33*a* is positioned above the load module 13, to an "unload" position, wherein the last substrate handler 33*e* is positioned above the unload module 23. The exemplary substrate handlers 33*a–e* are fixedly coupled horizontally, and thus move horizontally as a unit. The exemplary substrate handlers 33*a–e* are also fixedly coupled vertically, and the substrate transfer mechanism 31 is movably coupled so as to lift and lower a distance Y (FIG. 1B) from a position wherein each substrate handler 33*a–e* operatively couples one of the substrate supports 25*a–f* (so as to place or extract a wafer thereon or therefrom), to a position wherein the lowest edge of each substrate handler 33 is at an elevation above the highest edge of each module 13–23. Thus the substrate handler 33 also moves vertically as a unit, between a "hand-off" position (wherein the substrate handlers 33*a–e* operatively couple the substrate supports 25*a–f*) as shown in FIGS. 1A and 1D, and a "transport" position (wherein the substrate handlers 33*a–e* are elevated above the modules) as shown in FIGS. 1B, 1C, 1E and 1F. The substrate handlers 33*a–e* may be removably coupled to the substrate transfer mechanism 31 (e.g., via a latch, etc.) so that each substrate handler may be easily removed or replaced, allowing the cleaning system to be easily reconfigured.

The operation of the inventive cleaning system 11 is described with reference to the timing diagram of FIG. 2 and with reference to the sequential views of FIGS. 1A–D, which show the movement of the substrate transfer mechanism 31 as it loads/hands off a plurality of single substrate batches, transports the plurality of single substrate batches, and unloads/hands off the plurality of single substrate batches.

FIG. 1A shows the cleaning system 11 during steady state processing in the load/hand-off position. The substrate handlers 33*a–e* operatively couple the substrate supports 25*a–e* of the load module 13, the megasonic cleaner 15, the first scrubber 17, the second scrubber 19 and the spin-rinse-dryer 21 respectively, so as to contact the edges of the semiconductor substrates $S_{1-5}$ positioned thereon.

Figure 1B:
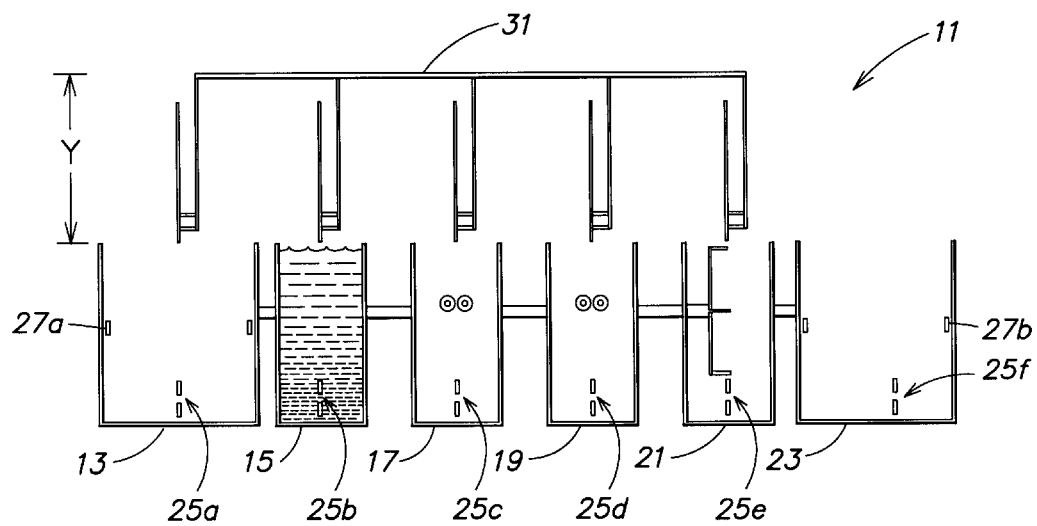
Figure 1C:
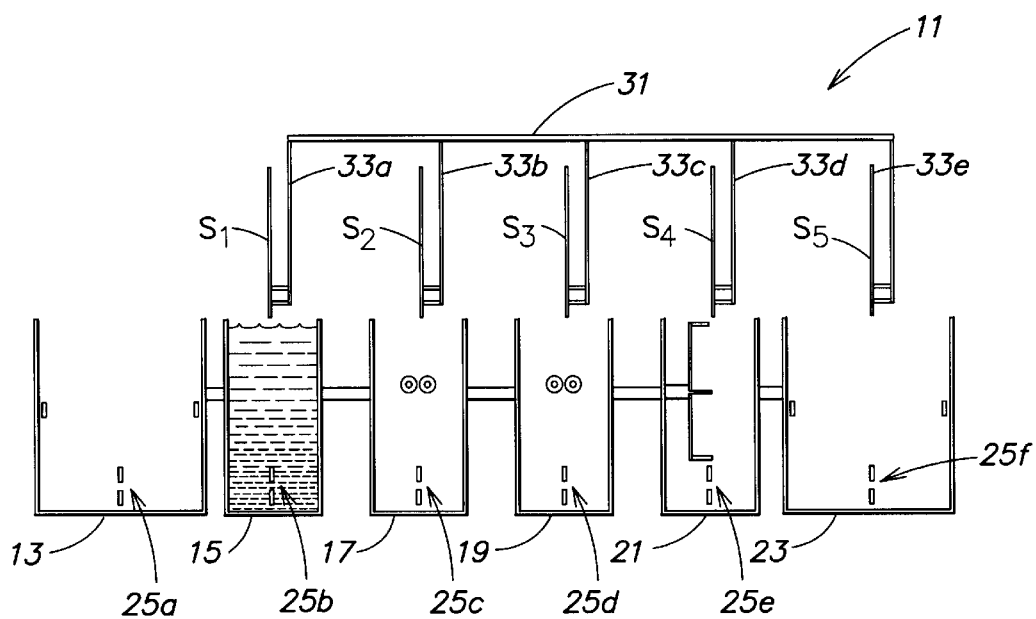
Figure 1D:
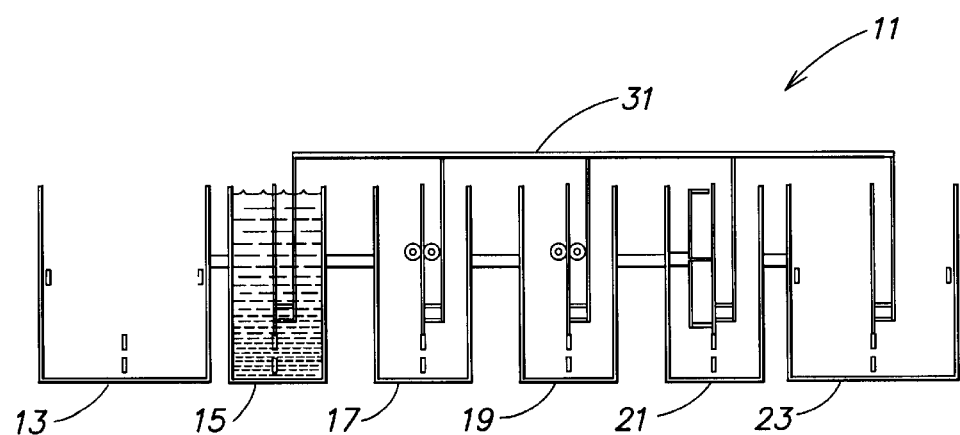

After gripping the substrates $S_{1-5}$ the substrate transfer mechanism 31 elevates the distance Y (FIG. 1B), to the transport position shown in FIG. 1B. As the substrate transfer mechanism 31 elevates, the substrate handlers 33a–e lift the semiconductor substrates $S_{1-5}$ from the substrate supports 25a–e, respectively. While in the transport position the substrate transfer mechanism 31 indexes horizontally the distance X (FIG. 1A), from the load position wherein the first substrate handler 33a is above the load module 13, and the last substrate handler 33e is above the spin-rinse-dryer 21, to the unload position wherein the first substrate handler 33a is above the megasonic cleaner 15, and the last substrate handler 33e is above the unload module 23, as shown in FIG. 1C. After indexing the distance X to the unload position the substrate handlers 33a–e are respectively positioned above the substrate supports 25b–f of the megasonic cleaner 15, the first scrubber 17, the second scrubber 19, the spin-rinse-dryer 21 and the unload module 23.

Figure 1E:
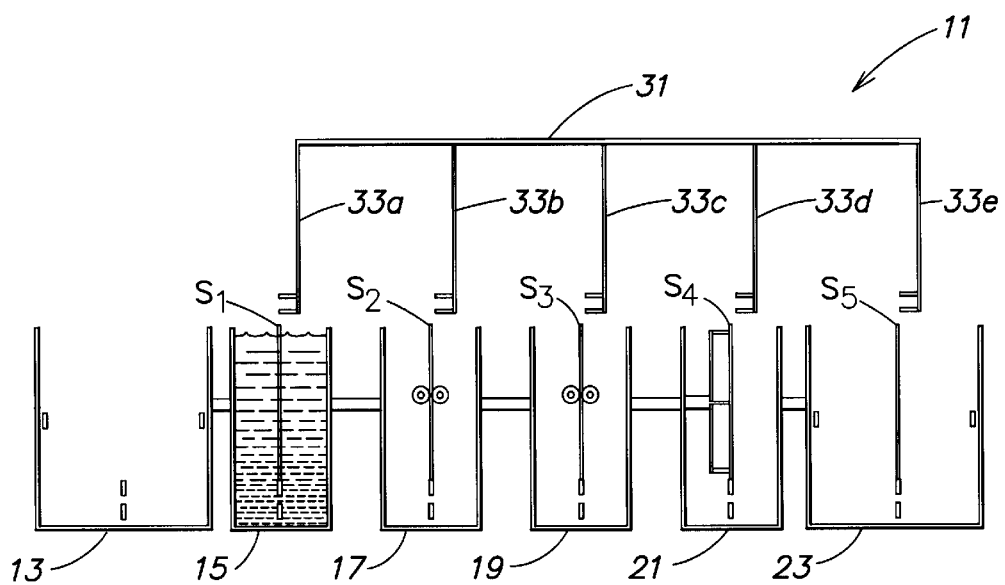
Figure 1F:
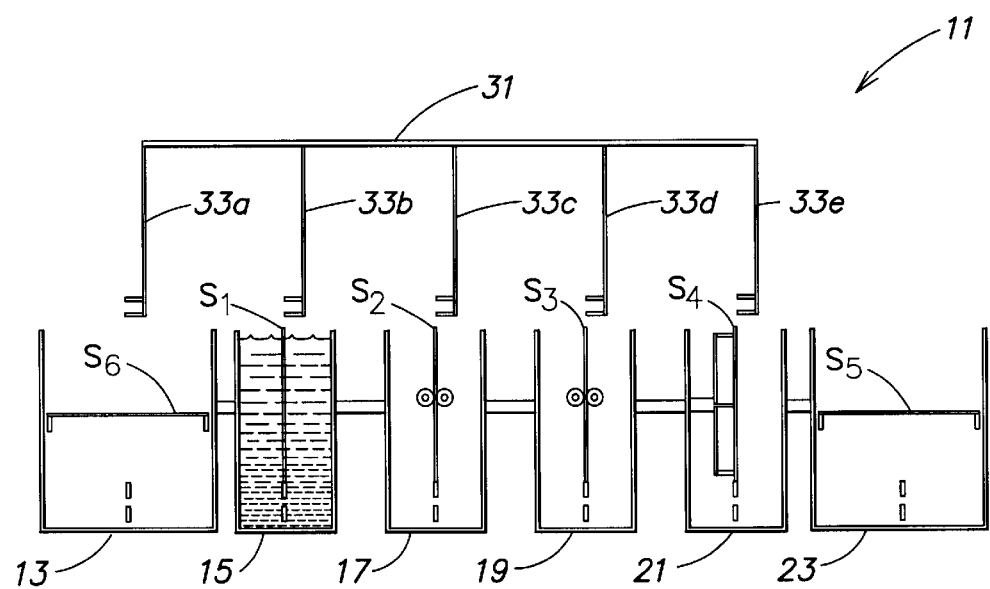

The substrate transfer mechanism 31 then lowers the distance Y to the unload/handoff position shown in FIG. 1D, wherein the substrate handlers 33a–e operatively couple the substrate supports 25b–, respectively. The substrate handlers 33a–e ungrip the substrates $S_{1-5}$ placing the substrates $S_{1-5}$ on the substrate supports 25b–f. The substrates $S_{1-5}$ are processed within the megasonic cleaner 15, the first scrubber 17, the second scrubber 19 and the spin-rinse-dryer 21, respectively, while the substrate transfer mechanism 31 elevates the distance Y (FIG. 1B) to the transport position as shown in FIG. 1E. The semiconductor substrates $S_5$ continue processing within the cleaning modules 15–21 while the substrate transfer mechanism 31 (still in the transport position) indexes the distance X (FIG. 1A) from the unload position to the load position shown in FIG. 1F.

While the substrate transfer mechanism 31 is indexing from the unload position to the load position, the rotation mechanism 27b within the exemplary unload module 23, rotates the substrate support 25f and the semiconductor substrate $S_5$ positioned thereon, from a vertical orientation to a horizontal orientation and may optionally perform flat finding to place the semiconductor substrate $S_5$'s flat in a known position. Also while the substrate transfer mechanism 31 is indexing from the unload position to the load position a horizontally oriented semiconductor substrate $S_6$ is loaded into the load module 13 (e.g., via a substrate handler not shown). The rotation mechanism 27a within the load module 13 then rotates the substrate support 25a and the semiconductor substrate $S_6$ positioned thereon, from a horizontal orientation to a vertical orientation.

Alternatively, the substrate handlers 33a–e may have end effectors configured to grasp flatted wafers regardless of their orientation, such as those disclosed in U.S. patent application Ser. No. 09/559,889, filed Apr. 26, 2000 (AMAT No. 3554) the entire disclosure of which is incorporated herein by this reference. Specifically, that application describes two opposing end effectors each having two pairs of opposing surfaces for contacting the edge of a substrate. Thus, the end effectors are designed to contact a substrate at four points along its edges. If a substrate is oriented such that a flatted region of the substrate is adjacent one of the contacting points (e.g., one of the pairs of opposing surfaces) the substrate may still be stably supported by the remaining three contact points. Each of the contact points may be radiused to follow the circumference of the substrate to thus ensure that contact occurs only along the substrates edges.

The load module may optionally perform flat finding to place the semiconductor substrate $S_6$'s flat in a known position where it will not be contacted by the substrate transfer mechanism 31. Each cleaning module may comprise a flat finding mechanism such that a substrate's flat is in a known position when contacted by the substrate transfer mechanism 31. For instance, the flat finder described in U.S. patent application Ser. No. 09/544,660, filed Apr. 6, 2000 (AMAT No. 3437/CMP/RKK) may be employed in the spin-rinse-dryer 21. A flat finder which may be used in the scrubbers 15, 17 and the megasonic tank 83 is described below with reference to FIGS. 6A–B and 7A–B.

Alternatively, rather than employing flat finding, if the substrate enters a module in a known position, a programmed controller can return the substrate to that position because the substrate supports of the various modules rotate the substrate at a known rate, and the rotation time can be selected so as to return the substrate to the known, "flat found" position provided the substrate supports are designed (e.g. with roughened surfaces) so as to prevent substrate slipping. After processing within the cleaning modules 15–21 is complete, the substrate transfer mechanism 31 lowers the distance X (FIG. 1A) to the load/handoff position as shown in FIG. 1A. Thereafter the sequence repeats, with the semiconductor substrate $S_5$ being unloaded from the unload module 23 (e.g., manually or by a substrate handler not shown) while the substrate transfer mechanism 31 is in the position shown in FIG. 1A or FIG. 1B.

The cleaning system 11 comprises a controller C operatively coupled to the substrate transfer mechanism 31. The controller C may comprise a program for moving the transfer mechanism 31 from a load/hand off position in which one of the substrate handlers 33a–e operatively couples the substrate support 25a of the load module 13 and the remaining wafer handlers each operatively couple the substrate support of one of the cleaning modules 15–21, to a transfer position in which the substrate handlers 33a–e are above the input module 13 and above the cleaning modules 15–21. The controller C is also programmed to shift the transfer mechanism 31 a distance X (FIG. 1A) such that each substrate handler 33a–e is positioned above the substrate supports of a cleaning module 15–21 or of the unload module 23, and to lower the transfer mechanism 31 to an unload/handoff position in which the substrate handlers 33e operatively couple the substrate support 25f of the unload module 23 and the remaining substrate handlers 33a–d each operatively couple a substrate support of one of the cleaning modules 15–21. Thus, the controller C may be programmed such that a plurality of substrates are simultaneously stepped through the plurality of single substrate load, clean and unload modules. Further, the controller C may be coupled to the rotation mechanism 27a of the load module 13 and to the rotation mechanism 27b of the unload module 23. The controller program may change semiconductor substrate orientation and may optionally perform flat finding at the load and the unload modules 13 and 23, while the substrate transfer mechanism 31 is in the transfer position, and/or may return substrates to a known flat found position as previously described.

Figure 2:
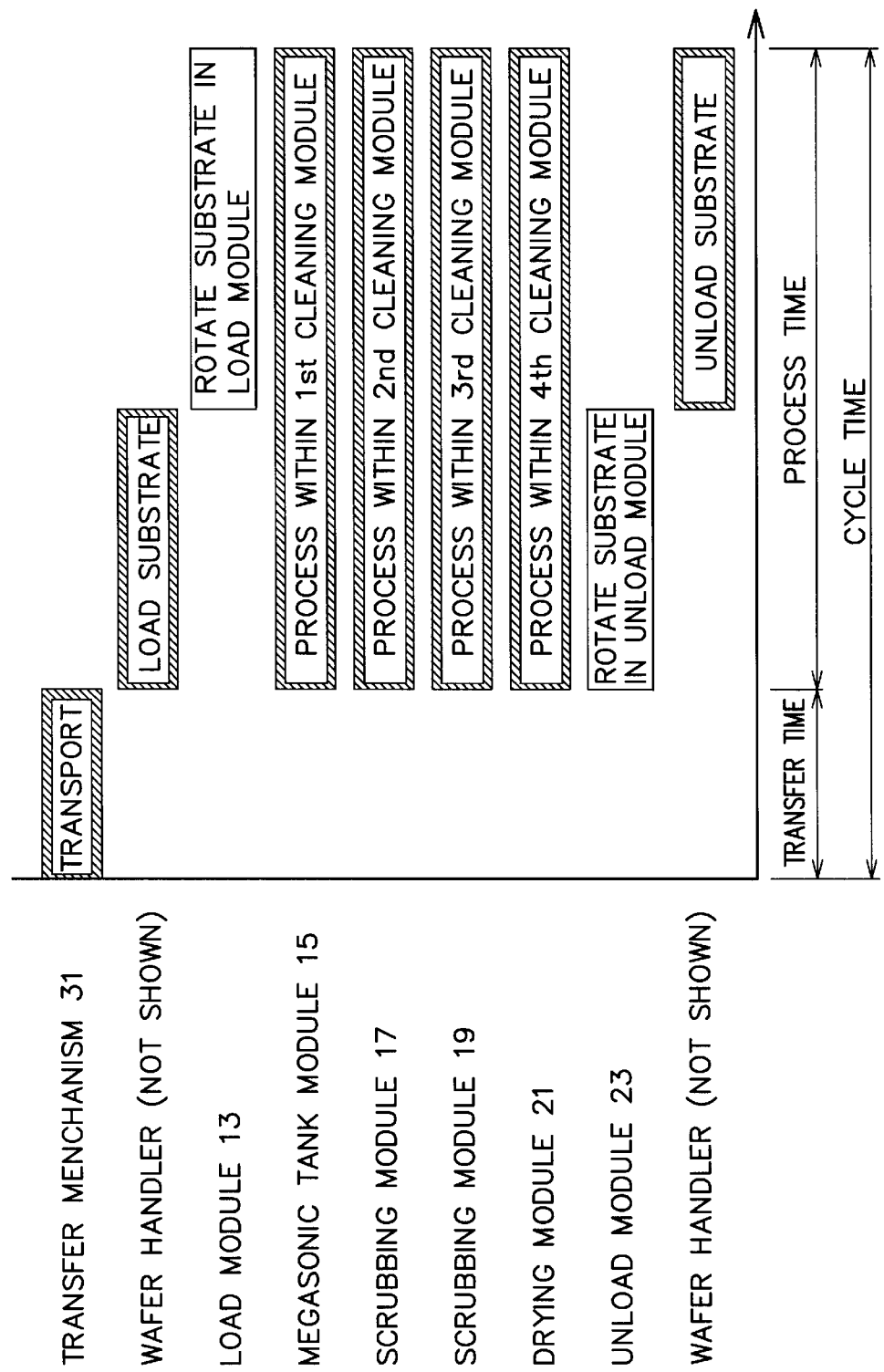
FIG. 2 is a timing diagram useful in describing the operation of the inventive cleaning system of FIGS. 1A–G.

As described above, and as best understood with reference to the timing diagram of FIG. 2, substrate load/unload, orient and the optional flat finding may occur while substrates are being processed within the cleaning modules. Thus, in the exemplary system of FIGS. 1A–F, the overall cleaning time of each semiconductor substrate is equal to the cycles of transport and six cycles of processing, and the cleaning modules operate continuously except during substrate transport. In this example, the cleaning modules 15–21 do not idle while substrates are loaded, unloaded, oriented or flats are found. Therefore during steady state processing, six semiconductor substrates exit the inventive cleaning system during the overall cleaning time of a single semiconductor substrate (i.e., during six cycles of transport and processing), and the steady state throughput of the inventive cleaning system equals the inverse of the sum of the transfer time and the process time.

The inventive cleaning system, may be configured for megasonically cleaning a substrate within a tank of fluid, followed by scrubbing the substrate. Such a configuration may more effectively remove large flat particles and particles located on the beveled edge of a semiconductor substrate, than do conventional systems which employ only megasonics or only scrubbers.

Figure 3A:
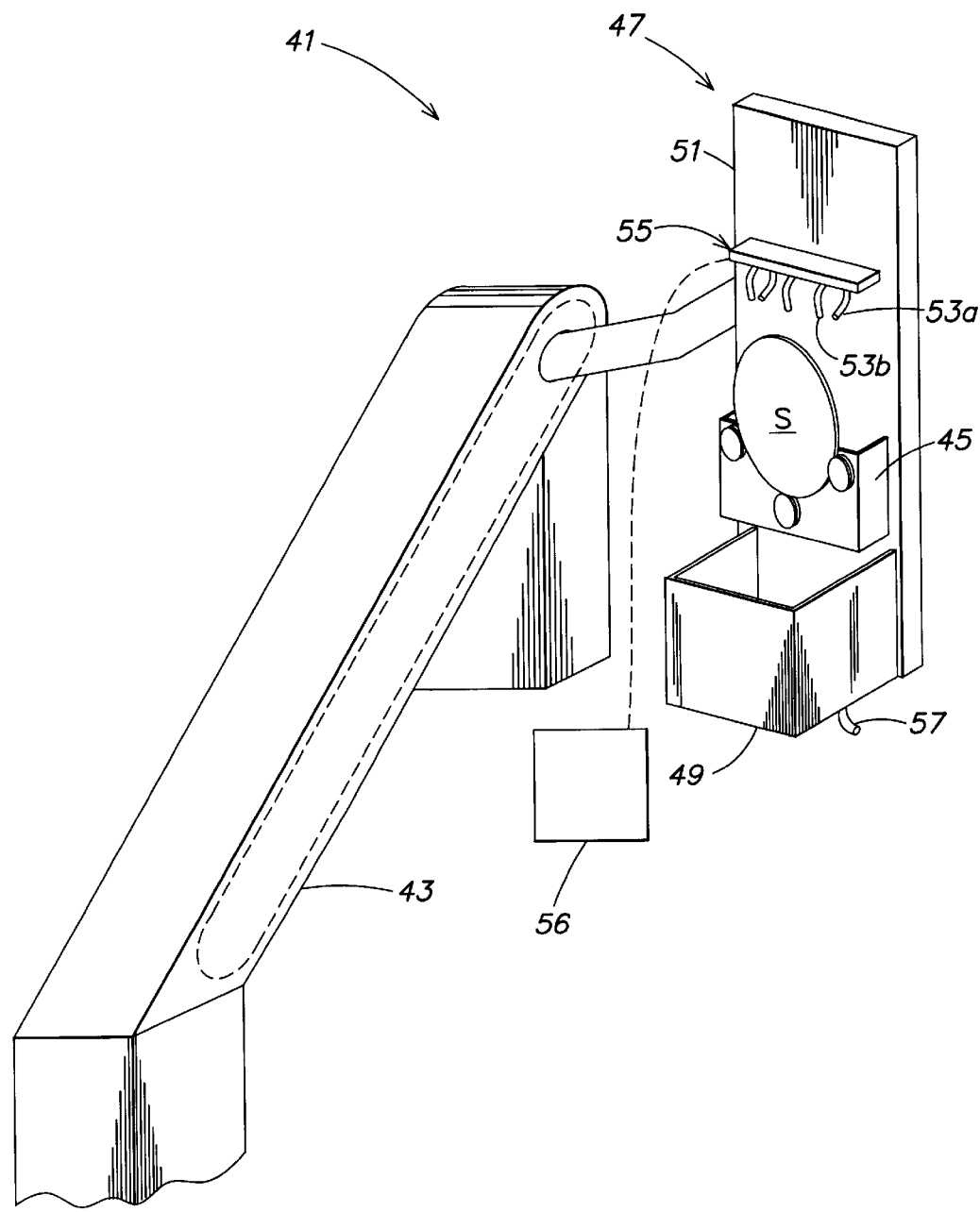
FIGS. 3A–C are side perspective views of an inventive interface module.
Figure 3B:
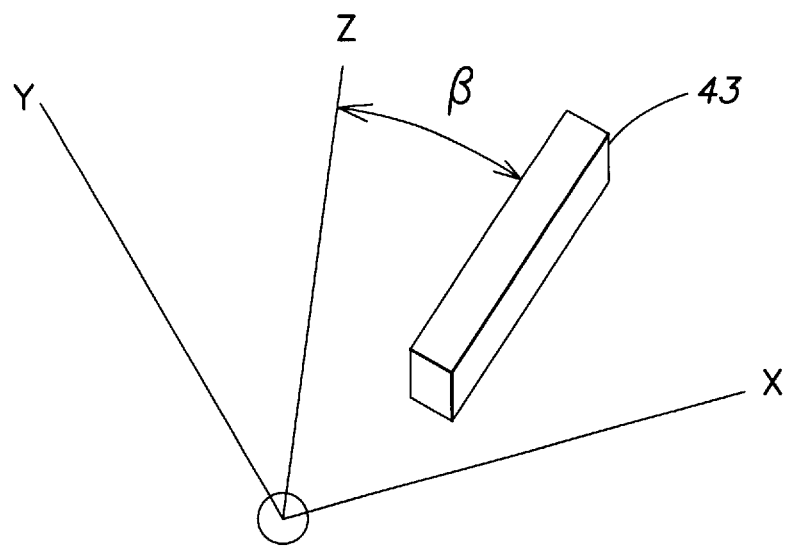
Figure 3C:
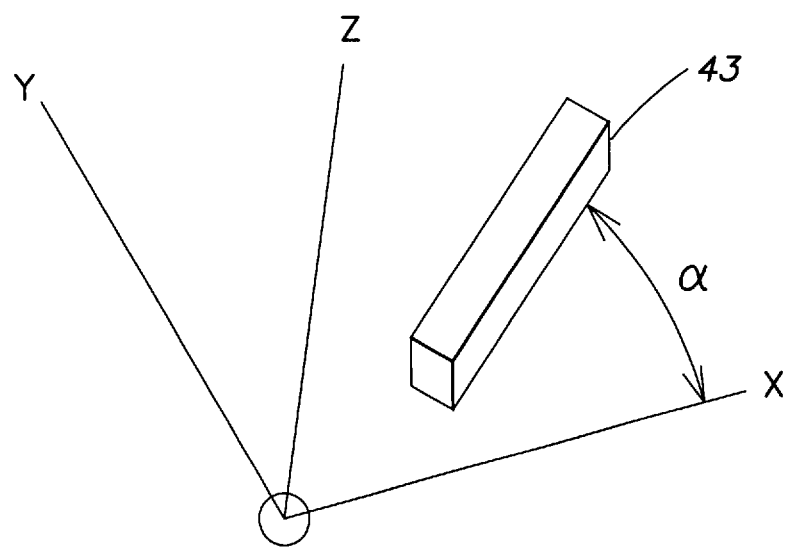

The input module 13 may comprise an interface module 41 as shown in FIGS. 3A–C, if substrates are to be received in a vertical orientation. FIGS. 3A–C are side perspective views of the inventive interface module 41. The interface module 41 comprises a track 43 which is coupled to a motor by a timing belt (both not shown) and a substrate cart 45 which is moveably coupled to the track 43. The track 43 may be positioned on a slope in the Z direction (represented by the angle "β" in FIG. 3B), by coupling one end of the track 43 at a higher elevation than the other end of the track 43 (as shown). Similarly, the track 43 may be slanted in the X direction (represented by the angle "α" in FIG. 3C). In this manner the interface module 41 may be easily positioned in a "3D" manner to receive a vertically oriented wafer from a wafer handler (not shown) and to carry the wafer to a position where it may be loaded into the cleaning module 15 of the cleaning system 11. Thus, the interface module 41 is easily adjustable to facilitate substrate transfer between wafer handlers which may be positioned at various angles.

Figure 4:
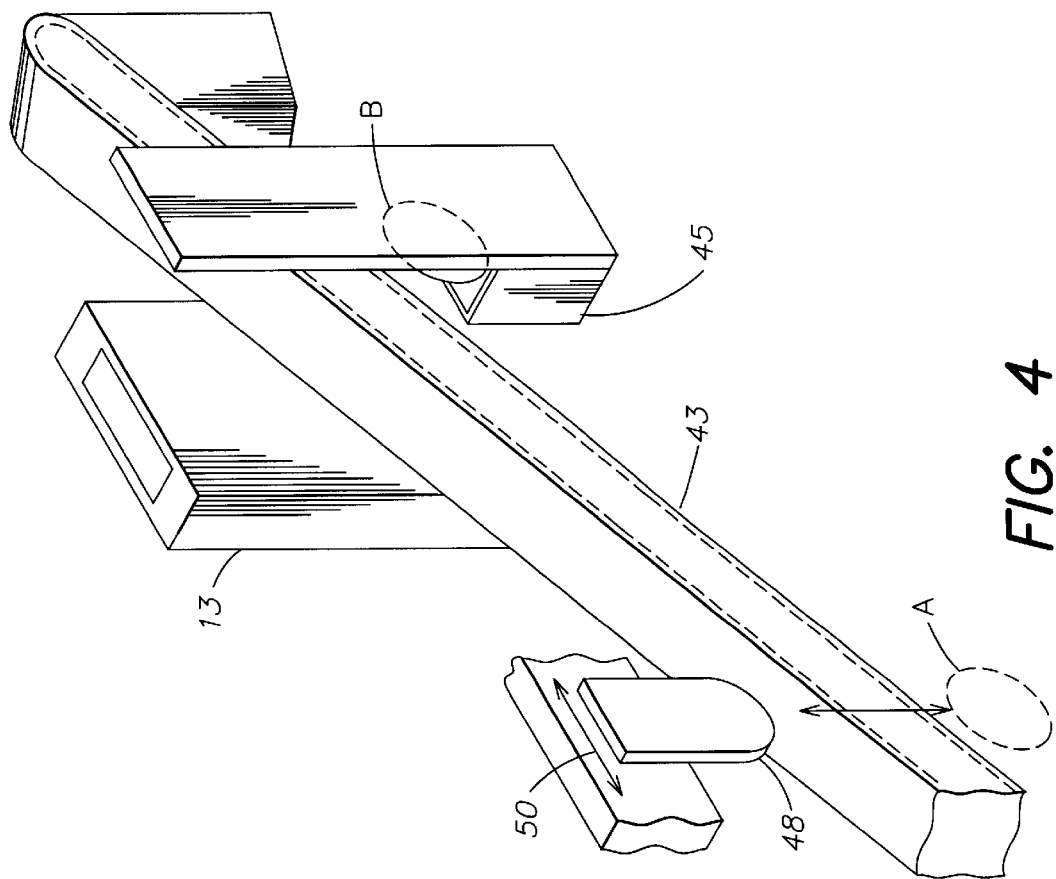
FIG. 4 is a perspective view showing the inventive interface module of FIGS. 3A–C coupled between an existing wafer handler and a cleaning module.

For example, as shown in FIG. 4, a wafer handler 48 travels along a track 50. The wafer handler 48 therefore may reach as far as a location A. The cleaning system 11's substrate transfer mechanism 31 requires a substrate S to be positioned at a location B in order to be gripped by the substrate handler 33a thereof. Accordingly, the interface module 41 is configured to extend between locations A and B, which have differing elevations (angle B) and differing locations in the X direction (angle α). The track 43 extends between locations A and B, and the substrate cart 45 is coupled to the track 43 with an angle that places the substrate cart 45 in line with wafer handler 48 when the substrate cart 45 is in a transfer position (at location A) and in line with substrate transfer mechanism 31 when the substrate cart 45 is in a load position (at location B). In order to allow the substrate cart 45 to be easily positionable the substrate cart 45 preferably comprises an adjustable arm, one end of which moveably couples the track 43 (so as to move therealong) with an angle that may be adjustable yet that may be fixed (e.g., once adjusted) so as to remain constant between positions A and B. Both the position of the track 43 (α, β) and the position of the substrate cart 45 relative to the track 43 may be easily adjustable so as to facilitate interfacing of various wafer handlers within a fabrication system.

Referring again to FIG. 3A, an optional wetting system 47 comprising a fluid collector 49, a splash back 51 which extends upwardly from the backside of the fluid collector 49, and one or more nozzles 53 which are mounted on the splash back 51 at a position and angle so as to wet both surfaces of the substrate S. For example, a spray bar 55 is positioned slightly above and, to enable wafer exchange from overhead, slightly in front of or in back of the substrate S, extends a length equal to the diameter of the substrate S, and has a set of nozzles 53a angled to direct a uniform line of fluid to the backsurface of the substrate S, and a set of nozzles 53b angled to direct a uniform line of fluid to the frontside of the substrate S. Either set of nozzles 53a, 53b may be replaced with a linear or squall type nozzle that outputs a line of fluid. The nozzles 53a, 53b are coupled to a fluid source 56. A fluid outlet 57 is coupled to the bottom of the fluid collector 49 to drain or pump fluid therefrom.

Referring to FIGS. 5A–D, the substrate cart 45 comprises two side rollers 59a, 59b, and a bottom roller 59c. Each of the rollers has a central notch or groove 61 (FIG. 5A), having a side wall angle (e.g., of 45°) such that only the edge of the substrate S contacts the rollers 59a–c. The notches thus reduce damage to the front or back wafer surfaces. The rollers 59a–c are positioned a sufficient distance apart so as to hold the substrate S in a fixed position and to prevent substrate wobble.

Figure 5A:
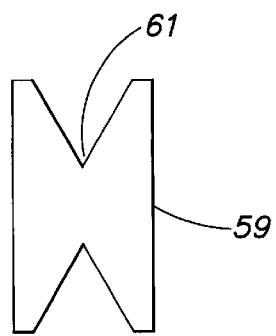
FIG. 5A is a side elevational view of a roller employed within the inventive interface module of FIGS. 3A–C.
Figure 5B:
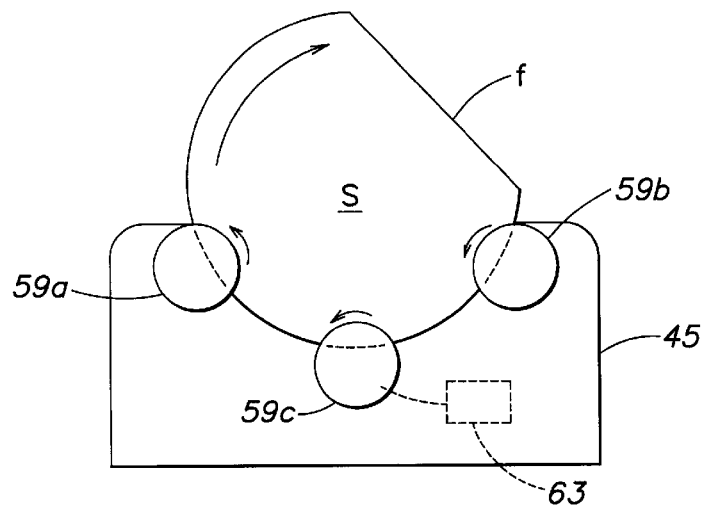
FIGS. 5B–C are front plan views of the cart employed within the interface module of FIGS. 3A–C, useful in describing wafer orientation.
Figure 5C:
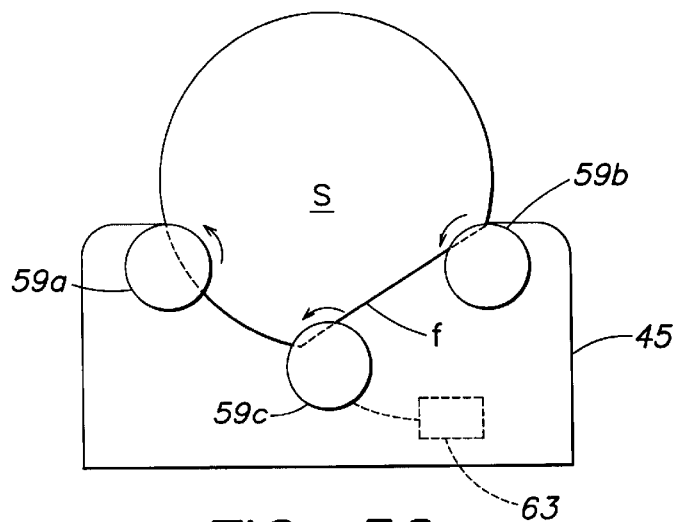

In one aspect of the invention, in order to achieve orientation of a substrate S having a flat f (FIG. 5), the bottom roller 59c is motorized, and is therefore coupled to a motor 63 which may be remotely located or may be mounted on the backside of the substrate cart 45. The side rollers 59a, 59b are configured to roll freely, and are not motorized. The side rollers 59a, 59b are positioned a sufficient distance apart so as to support the substrate S such that the flat f does not contact the bottom roller 59c when the substrate S is supported by the side rollers 59a, 59b (FIG. 5C).

In operation, the substrate cart 45 travels along the track 43 to assume the transfer position (at location A), shown in phantom in FIG. 4, and the wafer handler 48 travels along the track 50 carrying a substrate S to position A. The wafer handler 48 places the substrate S in the substrate cart 45 and the substrate cart 45 begins to travel up the track 43 toward the load position (location B). In this example, while the substrate cart 45 is traveling along the track 43 fluid from the nozzles 53a, 53b prevents the substrate S from drying. The fluid runs off the substrate S into the fluid collector 49. The splash back 51 prevents fluid from splashing or otherwise exiting the vicinity of the cleaning system 11. Any fluid which enters the substrate cart 45 drains therefrom via holes (not shown) to the fluid collector 49. Fluid collects in the fluid collector 49 and is drained therefrom via the fluid outlet 57. Because the substrate preferably is rotating (as described below), the nozzles 53a, 53b may be positioned on the side, bottom, etc. Alternatively, the nozzles may be stationarily positioned at the transfer location, the load location or anywhere therebetween.

In one aspect, while the substrate cart 45 is traveling along the track 43 toward the load position (location B), the bottom roller 59c rotates, causing the substrate S to rotate therewith. The side rollers 59a, 59b roll passively due to their contact with the rotating substrate S. As soon as the flat f reaches the bottom roller 59c, (FIG. 5C) the bottom roller 59c no longer has sufficient frictional contact with the substrate S to rotate the substrate S. By the time the substrate cart 45 reaches the load position (location B), the substrate S will have been rotated via the bottom roller 59c to a position where the leading edge of the flat f is adjacent the bottom roller 59c. Accordingly, the substrate handler 33 of the substrate transfer mechanism 31 can grip the substrate S without risk of contacting the flat f, which may cause the substrate handler 33 to drop the substrate S (depending on the specific configuration of the substrate handler's end effectors). Thereafter, the nozzles 53a, 53b turn off and the substrate handler 33 grips the substrate S, the substrate transfer mechanism 31 elevates and indexes forward to position the substrate S above the first cleaning module 15, as previously described. As soon as the substrate S is lifted from the substrate cart 45, the substrate cart 45 may begin traveling along the track 43 toward the transfer position (location A).

Figure 6A:
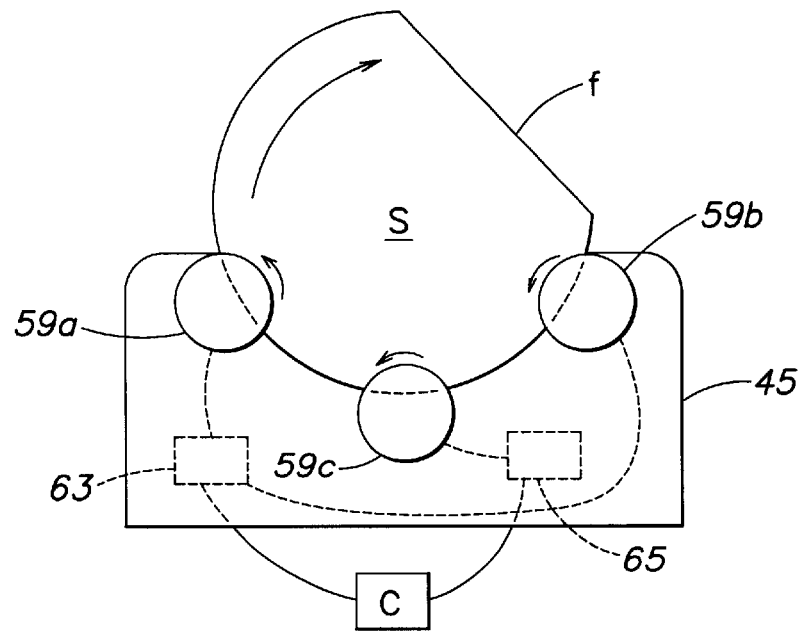
FIGS. 6A–B are front plan views of the cart employed within the interface module of FIGS. 3A–C, useful in describing an apparatus generally useful for wafer orientation and rotation monitoring.
Figure 6B:
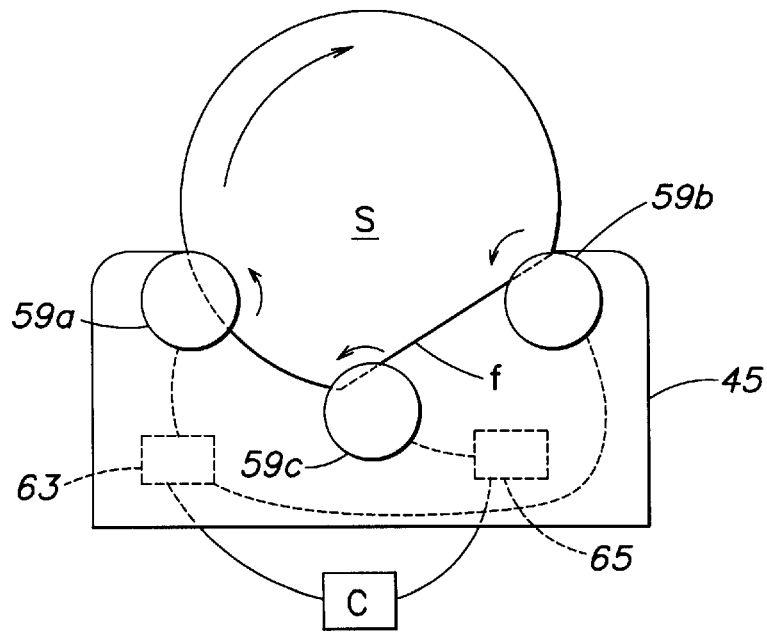

An alternative embodiment for orienting the substrate S is shown in FIGS. 6A and 6B. In this embodiment, the side rollers 59a, 59b are coupled to the motor 63, and a sensor, generally represented by the number 65 in FIGS. 6A–B, is coupled to the bottom roller 59c for measuring the velocity of rotation thereof. The sensor 65 may be an incremental encoder (e.g., a magnetic or optical tachometer for measuring velocity of rotation) that is capable of generating pulse frequencies proportional to roller speed.

In operation, when the side rollers 59a, 59b rotate, the substrate S rotates therewith. The friction between the rotating substrate S and the bottom roller 59c causes the bottom roller 59c to rotate. The bottom roller 59c may be damped, such that as soon as the flat f reaches the bottom roller 59c and the bottom roller 59c looses contact with the edge of the wafer, the bottom roller stops rotating. Accordingly the sensor 65 sends a signal to a controller C. Thereafter, the controller C can signal the motor 63 to cease rotation of the side rollers 59a, 59c in which case the substrate will be in a known position with the leading edge of the flat f adjacent the bottom roller 59c. Alternatively the controller may position the flat f in any other desired location by rotating the rollers at a known speed for an appropriate period of time, provided the rollers are designed to avoid substrate slippage.

In addition to flat finding, the "orienter" of FIGS. 6A and 6B can be used to monitor the rotation of a substrate, whether flatted or not. When employed for rotation monitoring, any of the supporting rollers may be coupled to rotate passively with the wafer, and may have the sensor 65 coupled thereto.

Figure 7A:
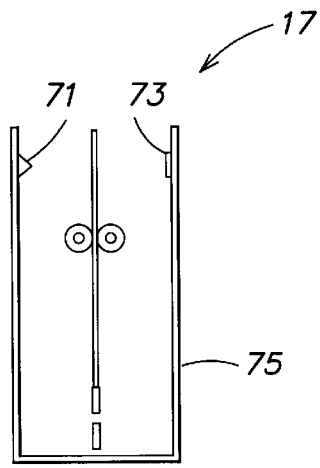
FIGS. 7A–C are a side view and two front views, respectively, of a through-beam sensor for orienting a wafer.
Figure 7B:
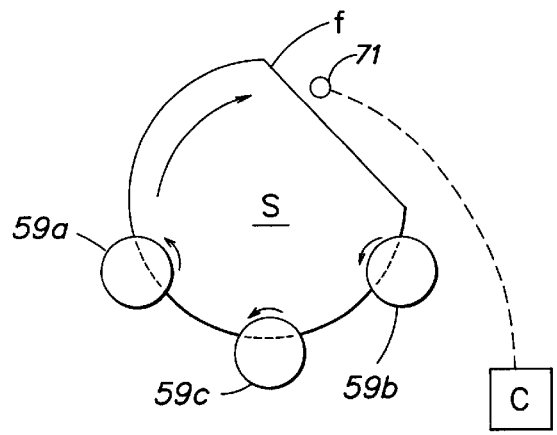
Figure 7C:
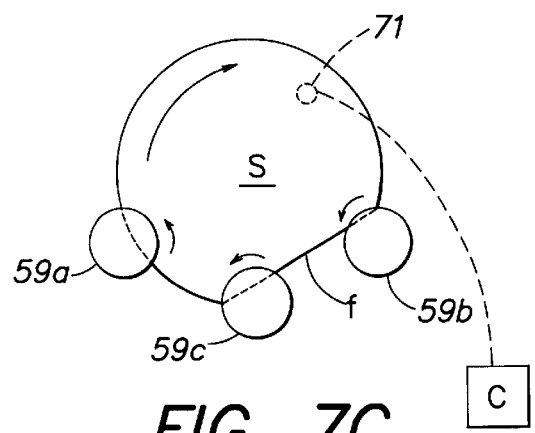

A further embodiment for orienting the substrate S, or for monitoring the rotation thereof, is shown in FIGS. 7A–C. This embodiment is particularly well suited for use within a scrubber, and is therefore shown within the first scrubber 17. A through-beam sensor comprising a beam emitter 71 (e.g., an optical emitter) and a receiver 73 (e.g., a photo diode) are mounted across from each other on the front and back surfaces, respectively, of the scrubber chamber 75. The emitter 71 and the receiver 73 are positioned at an elevation where the beam emitted from the emitter 71 strikes the surface of the substrate S, near its edge, and is therefore prevented from reaching the receiver 73 unless the flat f is in the region between the emitter 71 and the receiver 73, as shown in FIGS. 7B and 7C. Like the embodiments of FIGS. 5A–6B, the emitter 71 and the receiver 73 are coupled to a controller C which processes the information received therefrom.

The inventive orienting mechanisms of FIGS. 5A–7C are applicable on their own (e.g., outside the cart 45) as well as within any roller based system which rotates a single substrate. Exemplary vertically oriented systems include but are not limited to megasonic tanks, and scrubbers such as those previously incorporated by reference. Similarly, the inventive orienters/rotation monitors described herein are equally applicable to any vertically or horizontally oriented system which rotates a single substrate via a plurality of edge rollers, e.g., scrubbers (with roller brushes or scanning disk brushes, etc.) spin-rinse-dryers, edge cleaners, etc.

Figure 8:
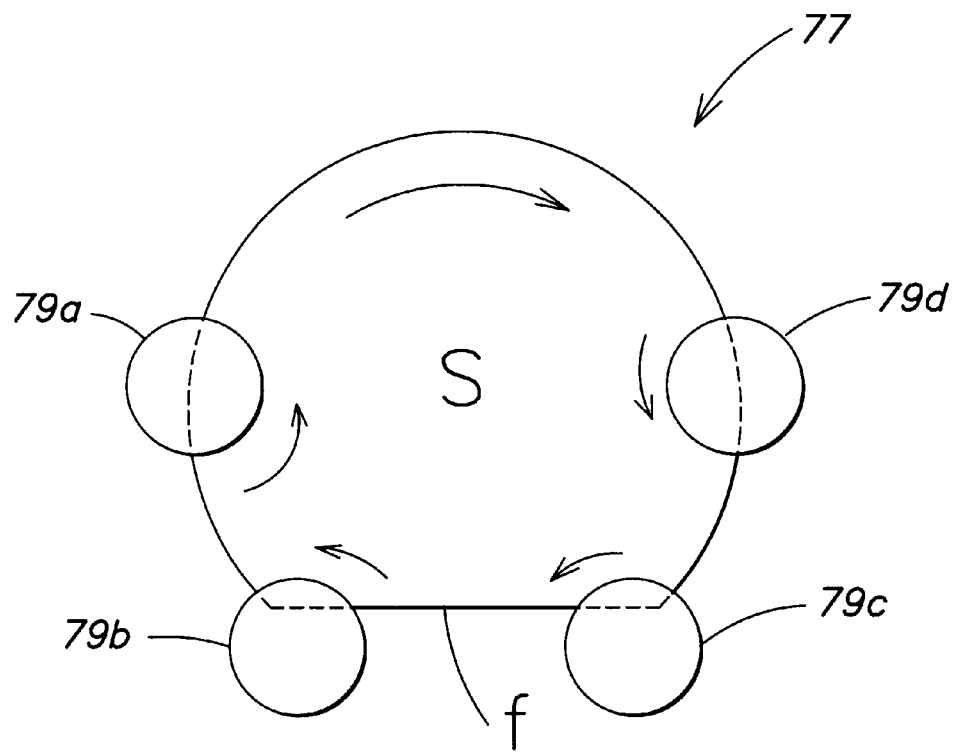
FIG. 8 is a schematic front elevational view of a substrate support that is particularly advantageous for rotating flatted substrates.

FIG. 8 is a schematic front elevational view of a substrate support 77 that is particularly advantageous for rotating flatted substrates. The inventive cleaning system 11 may employ the substrate support 77 within any module that requires rotation. The substrate support 77, however, may be used within any apparatus that rotates a flatted wafer, and is not limited to use within the cleaning apparatuses disclosed or incorporated herein.

The inventive substrate support 77 comprises four rollers 79a–d. The two bottom rollers 79b, 79c are spaced by a distance equal to the length of the flat f, of the substrate S positioned on the substrate support 77 (e.g., roller 79b and 79c may each be positioned 29–29½° from normal). The remaining two rollers 79a, 79d may be positioned at any location so long as they contact the edge of the substrate S. One or more of the rollers 77a–d is coupled to a motor (not shown), and the remaining rollers (if any) are adapted to roll freely when the substrate S rotates.

In operation, the motorized roller(s) are energized and the substrate S begins to rotate. As the substrate S rotates at least three of the four rollers 79a–d maintain contact with the substrate S, despite the instantaneous position of the flat f. When at least rollers 79a and 79d are both motorized, the substrate S will rotate. However, the substrate S will rotate more smoothly, and substrate/roller slippage may be completely avoided if all four rollers 79a–d are motorized. Accordingly, this configuration is particularly desirable for use within megasonic cleaners (particularly tank type cleaners) or scrubbers where smooth continuous substrate rotation provides more uniform cleaning, yet is often difficult to achieve as the fluid employed within such cleaning apparatuses may tend to increase substrate/roller slippage.

The modularity of the inventive cleaning system allows for any number of configurations. Exemplary cleaning system configurations are as follows:

1. megasonic tank, scrubber, scrubber, spin-rinse-dryer;
2. megasonic tank, scrubber, spin-rinse-dryer;
3. megasonic tank, megasonic tank, spin-rinse-dryer;
4. megasonic tank, spin-rinse-dryer;
5. scrubber, megasonic tank, scrubber, spin-rinse-dryer;
6. scrubber, scrubber, megasonic tank, spin-rinse-dryer;
7. scrubber, megasonic tank, spin-rinse-dryer;
8. megasonic tank, rinsing tank, spin-rinse-dryer;
9. megasonic tank, megasonic rinsing tank, spin-rinse-dryer;
10. megasonic tank, rinse, megasonic, rinse, spin-se-dryer;
11. megasonic tank, scrubber, etch bath, rinse, spin-rinse-dryer;
12. megasonic tank, megasonic rinse, etch bath, rinse, spin-rinse-dryer;
13. megasonic rinse, etch, rinse, spin-rinse-dryer;
14. etch bath, scrubber, megasonic tank, spin-rinse-dryer;
15. etch bath, rinse, megasonic tank, spin-rinse-dryer; and
16. etch bath, megasonic tank, spin-rinse-dryer.

An exemplary etch bath chemistry is diluted hydrofluoric acid, and an exemplary cleaning solution (e.g., for use in the scrubber, megasonic tank, etc.) is SC1.

Additionally, the input module and/or the output module may be omitted and substrates may be loaded directly to the first cleaning module, and/or unloaded directly from the last cleaning module. Vertically oriented wafers may be loaded into the input module and/or unloaded vertically from the output module (e.g., the input module may comprise a chamber for receiving a vertically orientated substrate and preventing the substrate from drying via spray, submersion etc., and the output module may comprise a location for receiving a vertically orientated substrate from the cleaner's wafer handler, and for allowing another substrate handler to extract the vertical substrate). In short, any combination of vertical or horizontal load and unload modules may be employed as may direct loading and unloading from the cleaning modules. Further, Marangoni drying may be employed within a tank module or within the spin-rinse-dryer 21, or in a separate Marangoni rinser and drier. An exemplary Marangoni drying module which may replace the spin-rinse-dryer 21 in the inventive cleaner is disclosed in U.S. patent application Ser. No. 09/280,118, filed Mar. 26, 1999 (AMAT No. 2894/CMP/RKK), the entirety of which is incorporated herein by this reference. Alternative Marangoni drying systems which may replace both the spin-rinse-dryer 21 and the output module are described with reference to FIGS. 9 and 10.

FIGS. 9 and 10 depict two embodiments of inventive Marangoni Dryers. FIGS. 9A and 9B are a front elevational view of a first embodiment of a first aspect of an inventive Marangoni drying module 81a showing the exterior thereof, and respectively showing a substrate receiving position and a substrate guiding position as described below. FIG. 9C is a front elevational view of the Marangoni drying module of FIG. 9B showing the interior thereof. FIGS. 9D–F are sequential side elevational views of the Marangoni drying module of FIGS. 9A–C useful in describing the operation thereof.

Although the inventive Marangoni drying modules 81a, 81b may be advantageously used within the cleaning system 11 (FIGS. 1A–F) as the last module thereof, they may also be used as a stand alone unit or as part of another cleaning system. The inventive Marangoni drying module 81a comprises a wet chamber 83, a drying chamber 85 positioned above the wet chamber 83, and a dry chamber 87 positioned above the drying chamber 85. The dry chamber 87 is coupled so that it may rotate either 90 or 180 degrees so as to place a dry substrate in a desired vertical or horizontal orientation as further described below.

Figure 9A:
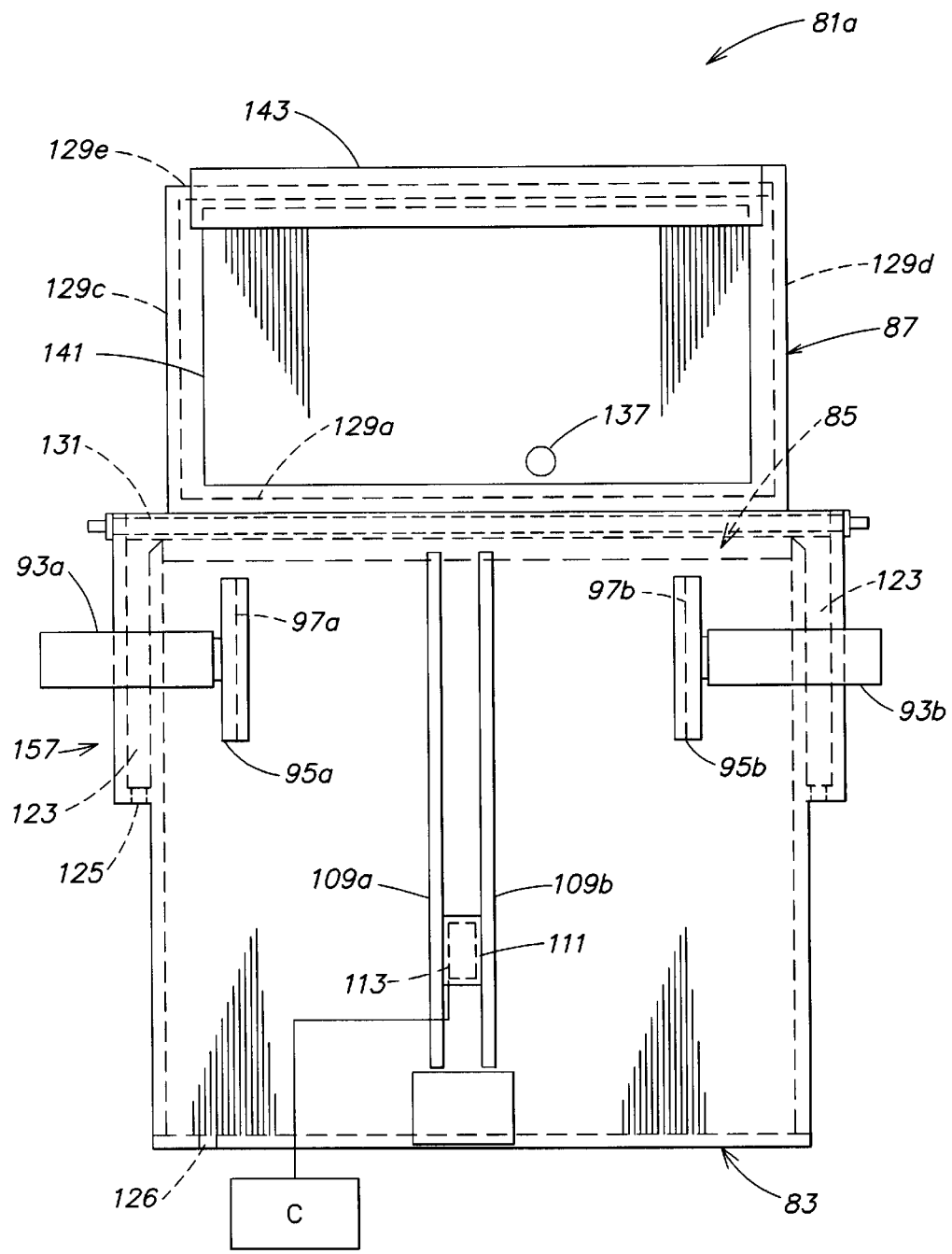
FIGS. 9A and 9B are a front elevational view of a first embodiment of a first aspect of an inventive Marangoni drying module 81*a* showing the exterior thereof, respectively showing a substrate receiving position and a substrate guiding position as described below.
Figure 9B:
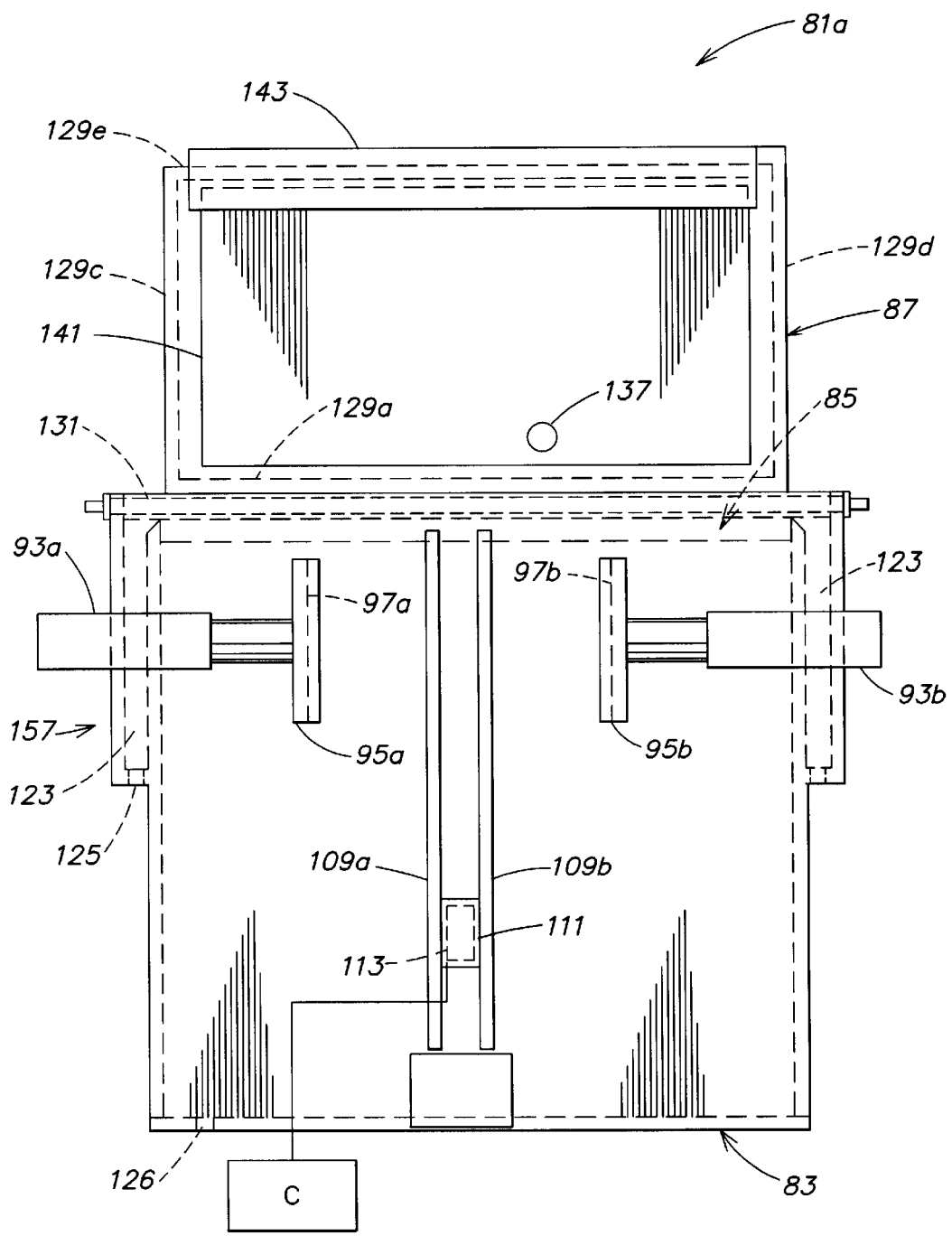

The interior of the wet chamber 83 (FIG. 9C) comprises a pair of substrate guide rails 89a–b which are adapted so as to move between a substrate receiving position (shown with reference to exterior view of FIG. 9A) wherein the guide rails 89 are positioned so as not to block an incoming wafer handler (not shown), and a substrate guiding position (shown with reference to the exterior view of FIG. 9B) wherein the guide rails 89 are positioned so as to contact the edges of a substrate and thus to restrict the lateral movement thereof as the substrate is lifted from the wet chamber 83 to the dry chamber 87. Each of the guide rails 89a–b has a permanent magnet 91a–b imbedded therein. A pair of guide rail actuators 93a–b are mounted to an outside wall of the wet chamber 83 (FIGS. 9A–B). A bar 95a–b, respectively, having permanent magnets 97a–b mounted thereto, is coupled to each guide rail actuator 93a–b. The exterior bars 95a–b (FIGS. 9A–B) and the interior pair of substrate guide rails 89a–b (FIG. 9C) are positioned such that their respective permanent magnets 91a–b, 97a–b magnetically couple through the wall of the wet chamber 83.

Figure 9C:
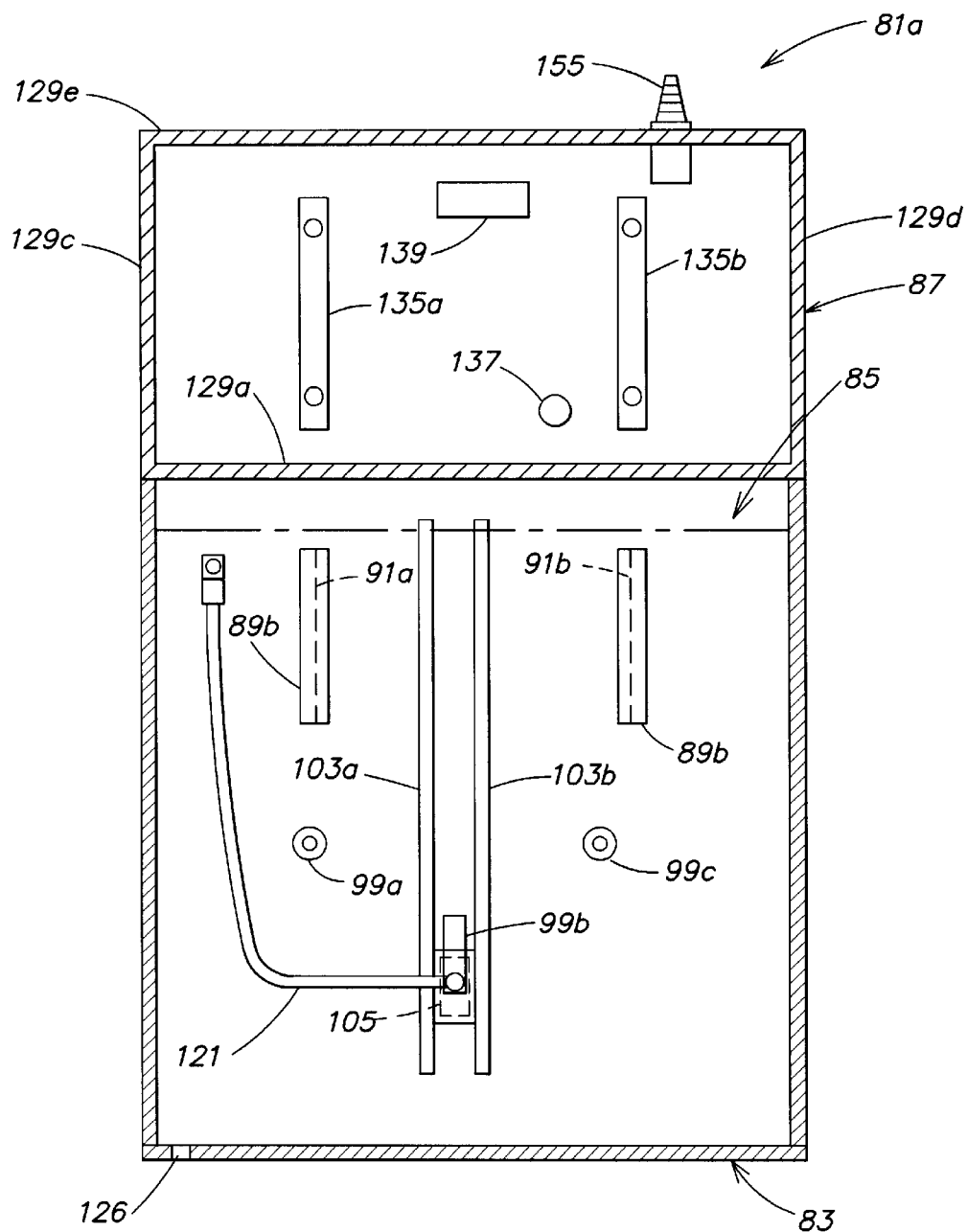
FIG. 9C is a front sectional view of the Marangoni drying module of FIG. 1B showing the interior thereof.
Figure 9D:
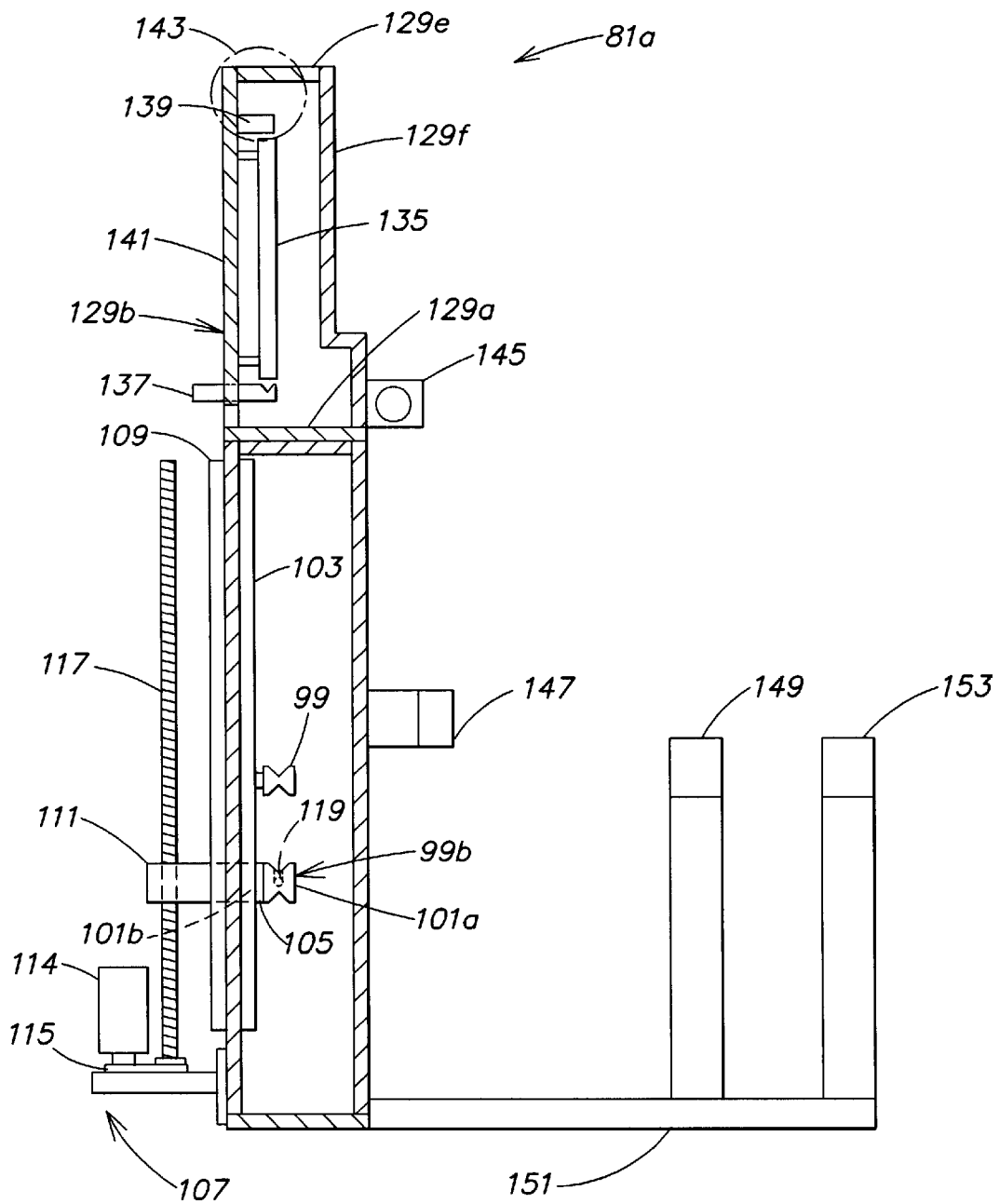
FIGS. 9D–F are sequential side sectional views of the Marangoni drying module of FIGS. 9A, 9B, and 9C, useful in describing the operation thereof.
Figure 9E:
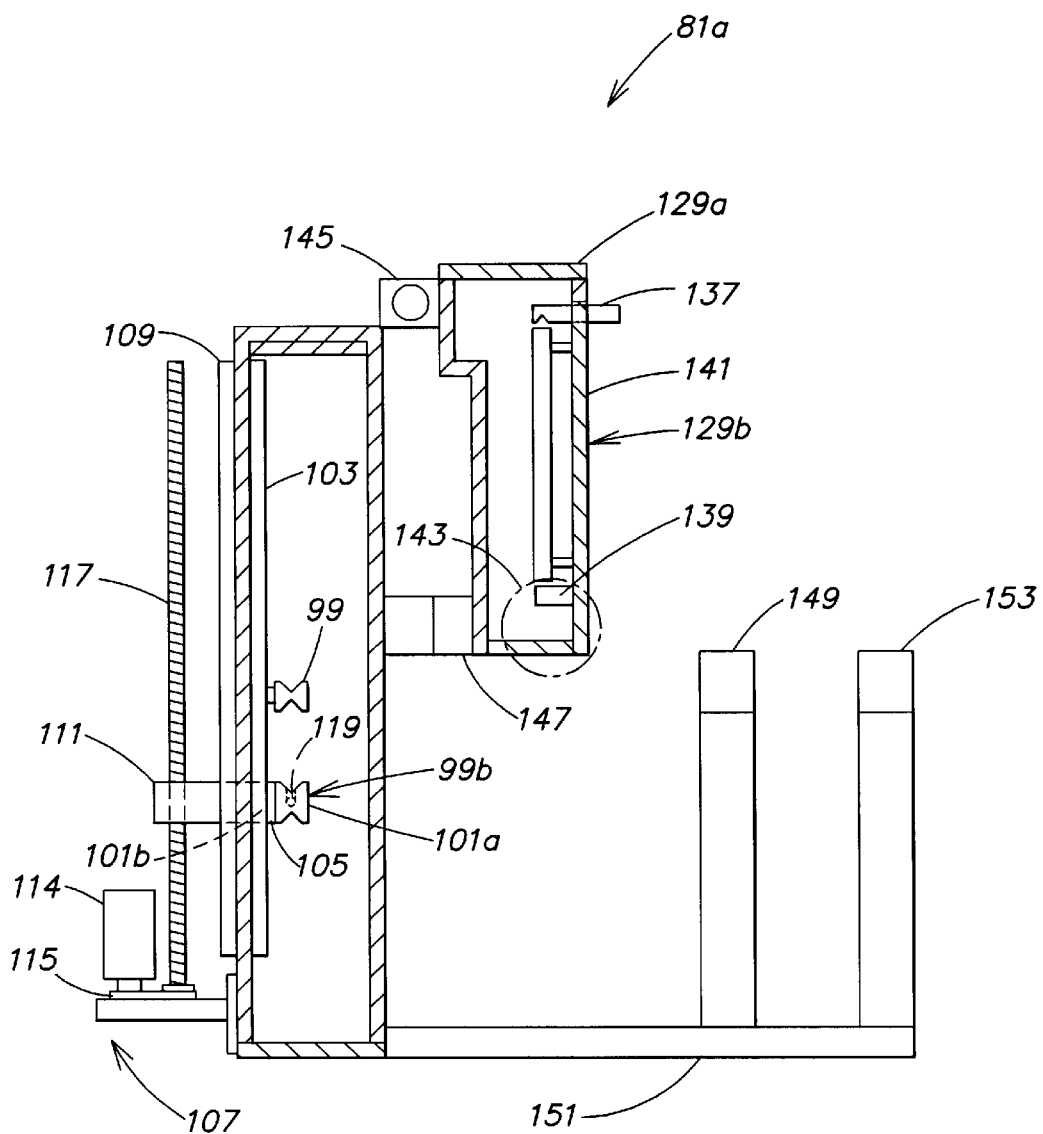
Figure 9F:
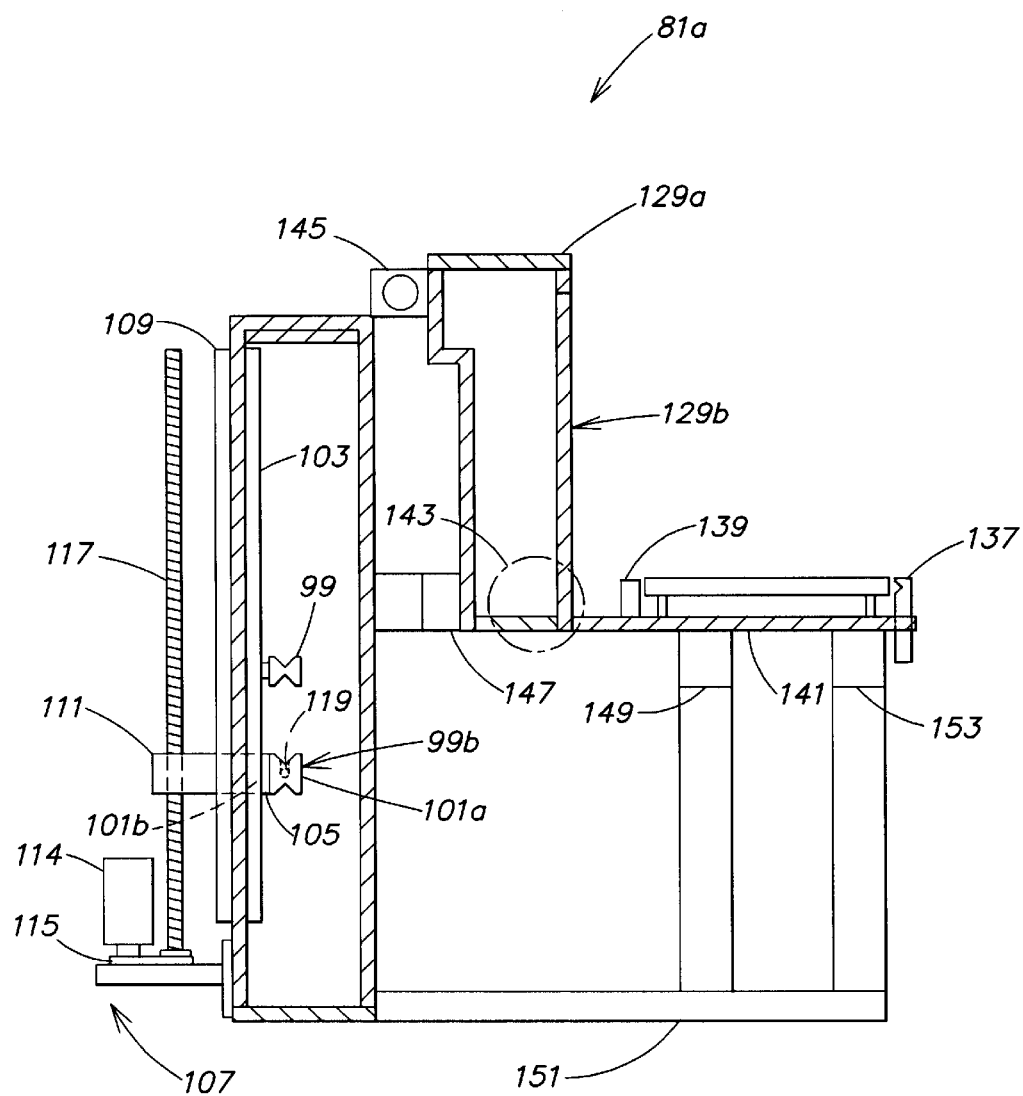

The interior of the wet chamber 83 (FIG. 9C) further comprises three substrate supports 99a–c, positioned to contact the lower edge of a substrate supported thereby. Two of the substrate supports (e.g. substrate supports 99a and 99c) are stationary, while the remaining substrate support (e.g. substrate support 99b) is movable. Specifically, the movable substrate support 99b has a substrate supporting end 101a, and a guide rail mounting end 101b (shown in the schematic side view of FIGS. 9D–F). The guide rail mounting end 101b is slidably positioned between a pair of substrate support guide rails 103a–b, which in turn are mounted to the inside wall of the wet chamber 83. The guide rail mounting end 101b has a permanent magnet 105 (FIG. 9C) mounted thereto. Positioned along the outside wall of the wet chamber 83 is a substrate vertical motion assembly 107 (FIGS. 9D–F). The substrate vertical motion assembly 107 comprises a pair of rails 109a–b which support a sliding mechanism 111 (FIGS. 9A–B). The sliding mechanism 111 has a permanent magnet 113 mounted thereto so as to couple through the wall of the wet chamber 83 to the magnet 105 mounted to the movable substrate support 99b (FIG. 9C). The substrate vertical motion assembly 107 further comprises a drive motor 114 drive motor 114, a belt drive 115 coupled to the drive motor 114 and a lead screw 117 coupled so as to drive the sliding mechanism 111 along the rails 109. The movable substrate support 99b also may comprise a vacuum hole 119 (FIGS. 9D–F), coupled to a vacuum line 121 (FIG. 9C).

The wet chamber 83 also comprises an overflow weir 123 having output holes 125 through which the overflow fluid is drained. Additionally, a fluid inlet 126 (FIGS. 9A–B) is provided for supplying fluid to the wet chamber 83.

The drying region 85 is located between the top of the rinsing fluid contained in the wet chamber 83 and a bottom wall 129a of the dry chamber 87. Gas supply tubes 131a–b (FIGS. 9A–B) are installed just above the rinsing fluid and so as to be on both sides of a substrate being guided by guide rails 89a–b. Nozzles (not shown) are formed in the gas supply tubes 131a–b by drilling fine holes in the thin wall and forming horizontal slots beginning at each fine hole and extending three-quarters of the wall thickness toward the internal diameter of the tubes 131a–b. The tubes 131a–b can be rotated to adjust the angle of vapor flow from the nozzles.

The dry chamber 87 comprises a plurality of walls 129a–f which form a sealed enclosure. Within the dry chamber 87 a second pair of substrate guide rails 135a–b are positioned to receive and guide a substrate as it is lifted from the wet chamber 83 through the drying region 85 into the dry chamber 87. The second pair of substrate guide rails 135a–b are positioned in line with the first pair of substrate guide rails 89a–b that are mounted therebelow in the wet chamber 83. The dry chamber 87 further comprises a vertical motion stop 137 (FIGS. 9A–F) that is adapted to selectively extend and retract so as to selectively allow substrate passage or provide substrate support. To achieve such selective extension and retraction, vertical motion stop 137 may magnetically couple through a wall 129 of the dry chamber 87. The dry chamber 87 may also comprise one or more substrate supports 139 (FIGS. 9C–F) positioned to support a substrate as the substrate changes orientation (e.g., changes from a vertical to a horizontal orientation as described below with reference to FIGS. 9E–F). In one aspect each of the second pair of substrate guide rails 135a–b, the vertical motion stop 137, and the dry chamber substrate support 139 are coupled to a door 141 of the dry chamber 87. Accordingly in this aspect, a substrate supported by the second pair of substrate guide rails 135a–b, the vertical motion stop 137, and the dry chamber substrate supports 139 will rotate with the door 141 as the door 141 of the dry chamber 87 is opened (as shown and described below with reference to FIGS. 9E–F).

The door 141 (FIG. 9A–B) of the dry chamber 87 is attached to the front wall 129b of the dry chamber 87 via a hinge 143 (FIGS. 9D–F). The hinge 143 may be coupled to a motor or other actuator so that the door 141 may be selectively opened and closed thereby. Further, the entire dry chamber 87 is rotatably coupled to the walls of the wet chamber 83 via a hinge 145 (FIGS. 9D–F). The hinge 145 may be coupled to a motor or the like so that the dry chamber 87 may be selectively rotated 180 degrees from the drying position shown in FIG. 9D to the open position shown in FIG. 9E. A rotation stop 147 (FIGS. 9D–F) may extend from a rear wall of the wet chamber 83 a sufficient distance so as to stop the rotation of the dry chamber 87 at a desired position (e.g. 180 degrees). Similarly, a door rotation stop 149 may extend upwardly from a base plate 151 (FIGS. 9D–F), a sufficient distance so as to stop the rotation of the dry chamber door 141 at a desired position (e.g., as shown in FIG. 9F, a position 90 degrees from the closed position). An additional support 153 (FIGS. 9D–F) may extend upwardly from the base plate 151 so as to provide additional support for the door 141 when the door 141 is in the open position as shown in FIG. 9F.

The dry chamber 87 further comprises sealing mechanisms (not shown) which ensure that the bottom wall 129a of the dry chamber 87 seals against the walls of the wet chamber 83, and ensure that the door 141 seals against the front wall 129b of the dry chamber 87. A gas inlet 155 (FIGS. 9A–C) is coupled through one of the walls 129 of the dry chamber 87 to supply gas to the dry chamber 87, so as to dilute the flow of vapor entering the dry chamber 87 from the drying region 85 and/or to pressurize the dry chamber 87. Further, the bottom wall 129a of the dry chamber 87 comprises a slot (not shown) that is slightly longer and wider than a substrate, and has a hole that is slightly larger than the diameter of the movable substrate support 99b. Accordingly a substrate may be transferred from the wet chamber 83 through the drying region 85 and into the dry chamber 87 via the slot (not shown), while the dry chamber 87 remains sealed to the walls of the wet chamber 83. Each moving part of the Marangoni drying system 81a as well as the pumps (not shown) which supply gases or fluids to the Marangoni drying system 81a are coupled to a controller C which controls the operation of the Marangoni drying system 81a as further described below.

In operation when a substrate S is to be loaded into the Marangoni drying system 81a, the hinge 145 which couples the dry chamber 87 to the wet chamber 83 rotates, causing the dry chamber 87 to rotate therewith to an open position, as shown in FIG. 9E. When the dry chamber 87 has rotated 180 degrees the dry chamber 87 contacts the dry chamber rotation stop 147 and accordingly ceases rotation. When the dry chamber 87 is in the open position (FIG. 9E), the wet chamber 83 is open and a substrate S may be inserted therein. To make room for an incoming substrate handler 157 (FIGS. 9A–B) the guide rail actuators 93a–b move the bars 95a–b outwardly. As the bars 95a–b move outwardly, the permanent magnets 97a–b (which are coupled to the bars 95a–b) magnetically couple through the wall of the wet chamber 83 to the permanent magnets 91a–b which are mounted to the first pair of substrate guide rails 89a–b. Accordingly the substrate guide rails 89a–b also move outwardly so as to assume the substrate receiving position shown in FIG. 9A. When the first pair of substrate guide rails 89a–b are in the substrate receiving position and the movable substrate support 99b is in the lower position as shown in FIG. 9C, the substrate handler 157 lowers the substrate S into the wet chamber 83, placing the substrate S on the substrate supports 99a–c. Thereafter the substrate handler 157 opens to release the substrate S and elevates to a position above the Marangoni drying system 81a. The hinge 145 then rotates the dry chamber 87 180 degrees until the dry chamber 87 is again sealed against the walls of the wet chamber 83 in the processing position as shown in FIG. 9D.

After the substrate S is positioned on the substrate supports 99a–c, the guide rail actuators 93a–b move inwardly causing the first pair of substrate guide rails 89a–b to assume the substrate guiding position shown in FIG. 9B. To elevate the substrate S the drive motor 114 is activated and motion therefrom is transferred through the belt drive 115 to the lead screw 117. The motion of the lead screw 117 causes the sliding mechanism 111 to slide upwardly along the rails 109 mounted to the outside of the wet chamber 83. The permanent magnet 113 mounted to the sliding mechanism ill couples through the wall of the wet chamber 83 to the magnet 105 mounted to the movable substrate support 99b. Accordingly as the sliding mechanism 111 moves upwardly, so does the movable substrate support 99b and, consequently, the substrate S positioned thereon.

As the upper portion of the substrate S enters the drying region 85 the upper portion of the substrate S leaves the pair of substrate guide rails 89a–b and is sprayed with vapors (e.g., IPA vapors) from the nozzles 133. The vapors mix with the film of fluid that remains on the surface of the substrate S as the substrate S is lifted from the fluid contained in the wet chamber 83. The vapors lower the surface tension of the fluid film, resulting in what is known as Marangoni drying. To enhance the Marangoni drying, a second set of nozzles (not shown) may supply a rinsing fluid to the surface of the substrate S as the substrate S is lifted from the wet chamber 83. The rinsing fluid nozzles (not shown) and the set of vapor nozzles 133 are positioned such that the vapor from the nozzles 133 mixes with the fluid film formed on the wafer via the rinsing fluid nozzles (not shown). The specific details of a Marangoni drying process that employs such a set of rinsing fluid nozzles is disclosed in commonly assigned U.S. patent application Ser. No. 09/280,118, filed Mar. 26, 1999 (AMAT No. 2894/CMP/RKK) the entire disclosure of which is incorporated herein.

After the upper portion of the substrate S passes the nozzles 133 and is dried thereby, the upper portion of the substrate S enters the dry chamber 87 via the slit (not shown) in the dry chamber 87's bottom wall 129a, and is guided by the second pair of substrate guide rails 135a–b as the substrate support 99b continues to elevate the substrate S. After the entire surface of the substrate S passes the vertical motion stop 137, the vertical motion stop 137 extends from the front wall 129b of the dry chamber 87, to position a groove formed therein, in line with the edge of the substrate S. Thereafter the movable substrate support 99b lowers, and the substrate S lowers therewith until contacting the vertical motion stop 137. Accordingly after contacting the vertical motion stop 137 the substrate S is supported by the vertical motion stop 137, by the second pair of substrate guide rails 135a–b, and by any additional substrate supports 139 which are positioned along the upper edge of the substrate S. As the moveable substrate support 99b begins to lower, vacuum is applied to vacuum hole 119 and any fluid that may be trapped against the substrate by the moveable substrate support 99b is suctioned from the substrate surface.

After the movable substrate support 99b lowers past the bottom wall 129a of the dry chamber 87, the hinge 145 is activated and rotates the dry chamber 87 one hundred and eighty degrees until the dry chamber 87 contacts the dry chamber rotation stop 147. After the dry chamber 87 begins rotation, the bottom wall 129a of the dry chamber 87 no longer seals against the wet chamber 83. Accordingly, as soon as the dry chamber 87 has rotated to a position where the dry chamber 87 no longer obstructs access to the wet chamber 83, a substrate handler such as the substrate handler 33 of FIG. 9 may insert a new substrate within the wet chamber 83. Thereafter, because the dry chamber 87 has rotated 180 degrees, the dry chamber 87's front wall 129b, although still vertically oriented, now faces rearwardly as shown in FIG. 9E. Thereafter the door hinge 143 is activated and rotates the door 141 from the vertically oriented positioned shown in FIG. 9E, wherein the door 141 seals against the front wall 129b of the dry chamber 87, to a horizontal orientation wherein the door 141 is supported by the door rotation stop 149 and the additional support 153. Because the second pair of substrate guide rails 135a–b are coupled to the door 141, the substrate S is also horizontally oriented as shown in FIG. 9F. The horizontally oriented substrate S may now be extracted from the Marangoni drying system 81a by a horizontal substrate handler (not shown). Accordingly, the inventive Marangoni drying system 81a, when employed as the last cleaning module of the cleaner (FIG. 9), may eliminate the need for a separate output module. Alternatively, if the mechanisms supporting the substrate are appropriately configured, the substrate may be extracted vertically from the dry chamber when the dry chamber has rotated 180° to the open position (FIG. 9E).

Note that the vertical motion stop 137 and the additional substrate supports 139 may advantageously be separated by a distance which is slightly greater than the diameter of the substrate S. Accordingly as the substrate S changes orientation the substrate S may be transferred from supporting contact with the vertical motion stop 137 (FIG. 9A) to supporting contact with the additional substrate supports 139 (FIGS. 9C–F). Thereafter, provided the additional substrate supports 139 are mounted to the door 141, the additional substrate supports 139 rotate with the door 141 as the door 141 opens. However, because of the positioning of the additional substrate supports 139 (e.g., below the substrate S when the dry chamber 87 is upside-down, and along the inner edge of the substrate S when the door 141 is in a horizontal position (FIG. 9F), the additional substrate supports 139 do not interfere with a horizontal wafer handler's extraction of the substrate S. The inventive Marangoni drying system 81a of FIGS. 9A–F is particularly advantageous for drying 200 mm substrates, although other size substrates may also be dried thereby.

Figure 10A:
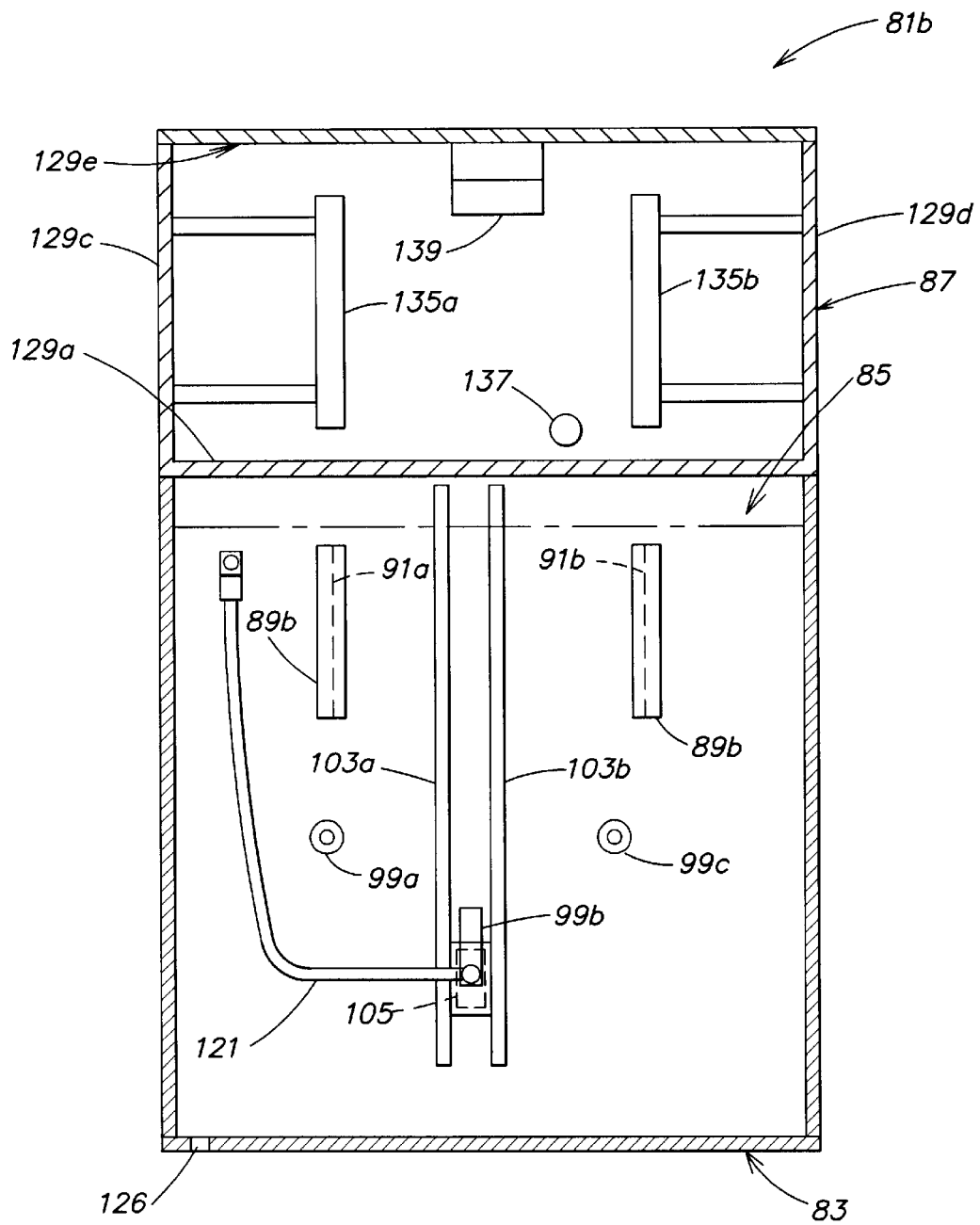
FIG. 10A is a front elevational view of a second embodiment of a Marangoni drying module.
Figure 10B:
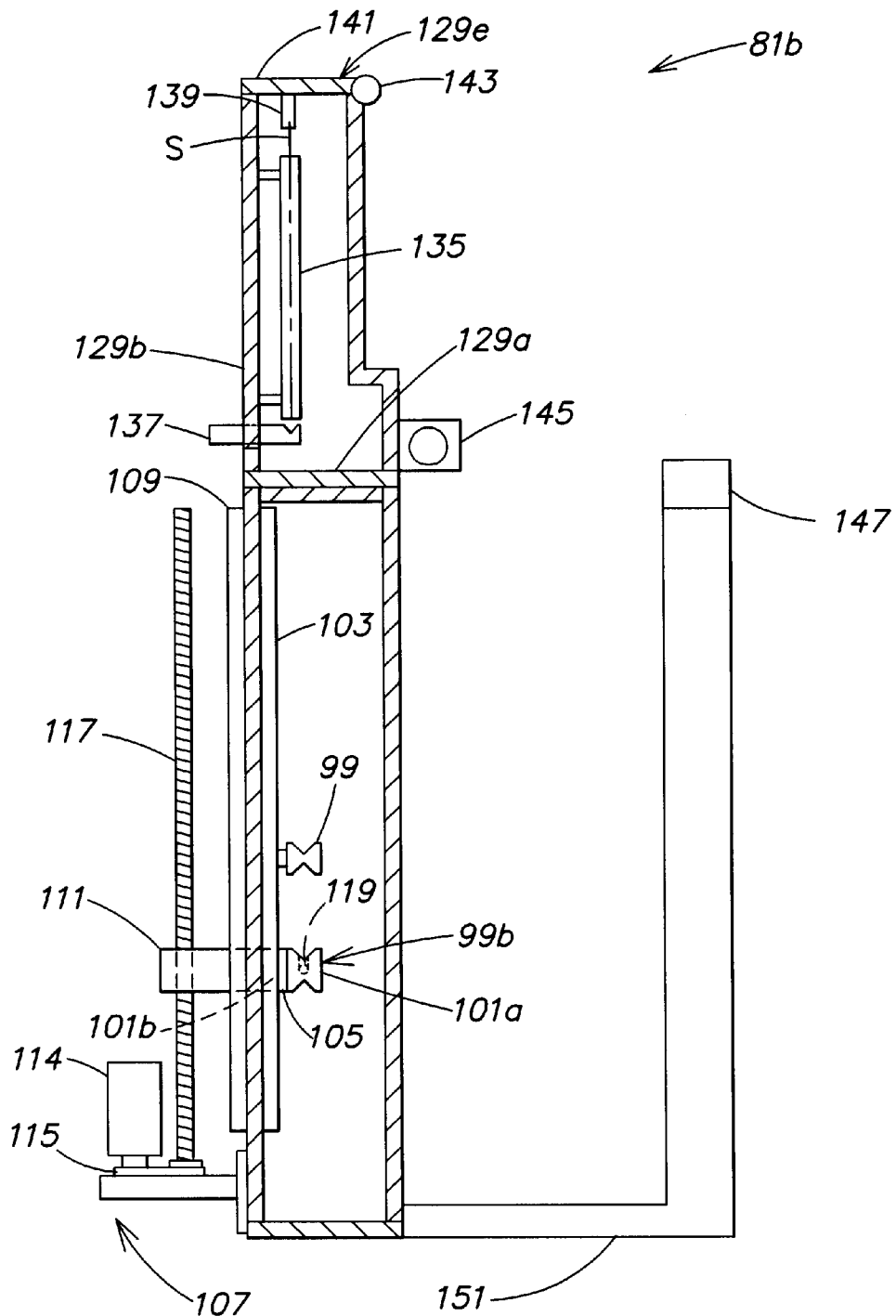
FIGS. 10B–D are sequential side sectional views of the Marangoni drying module of FIG. 10A, useful in describing increased throughput thereof.
Figure 10C:
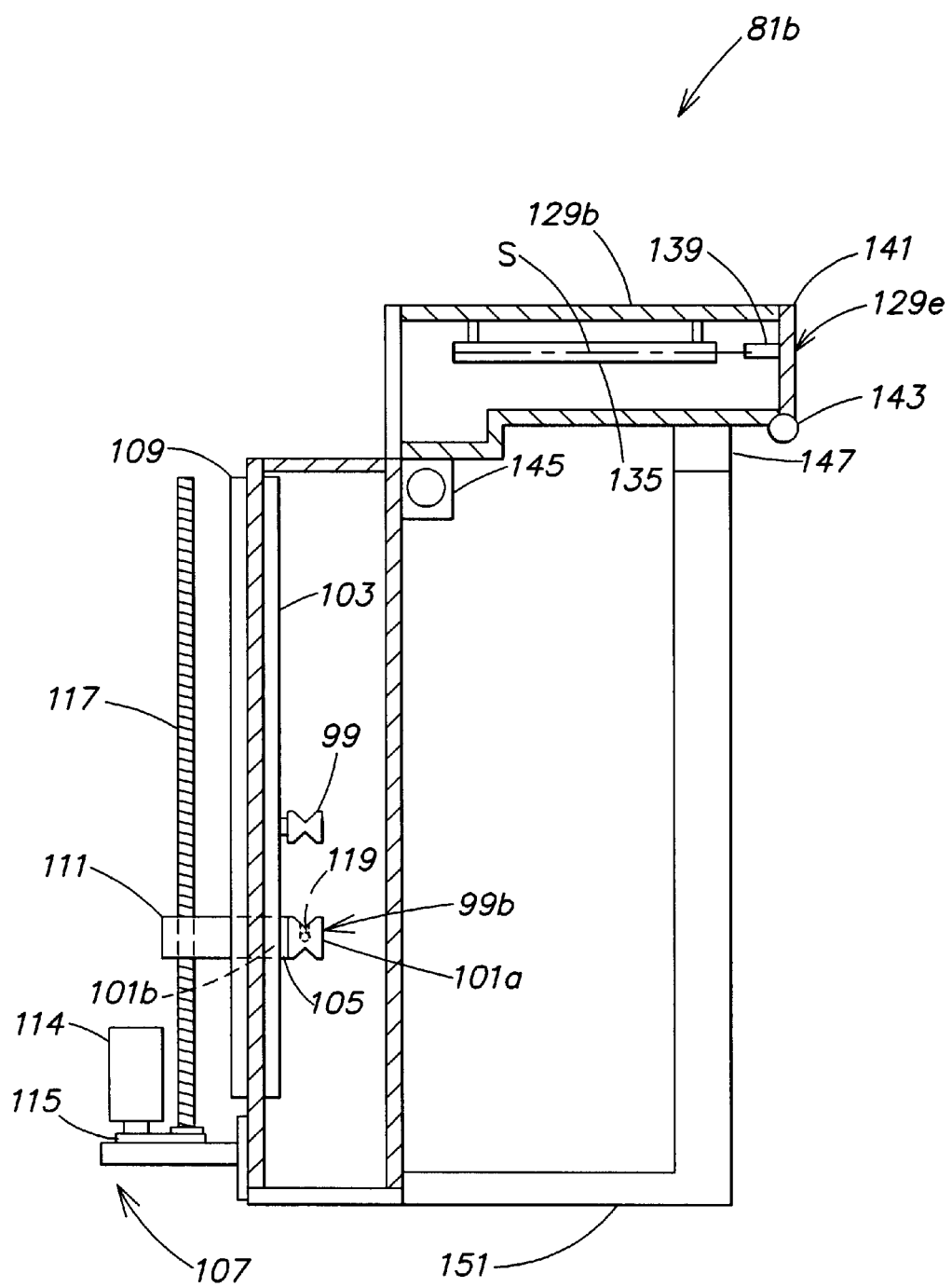
Figure 10D:
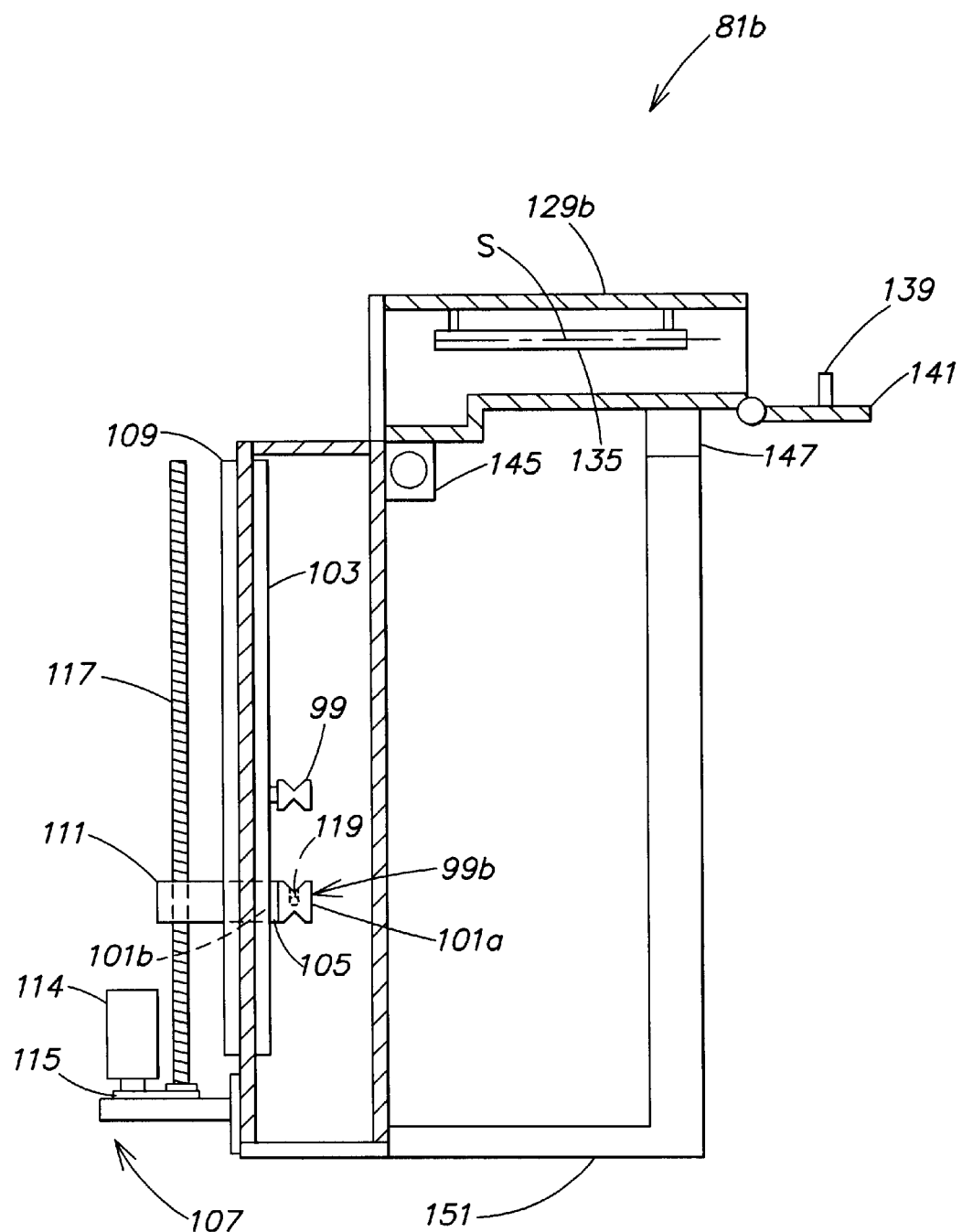

An alternative embodiment of the inventive Marangoni drying system 81a is shown and described with reference to FIG. 10A, which respectively shows a front elevational view of an alternative Marangoni drying system 81b. FIGS. 10B–D are sequential side sectional views of the Marangoni drying module of FIG. 10A, useful in describing increased throughput thereof. The alternative Marangoni drying system 81b is, for the most part, structurally and functionally identical to the Marangoni drying system 81a of FIGS. 9A–F, accordingly only those aspects of the alternative Marangoni drying system 81b which differ from the Marangoni drying system 81a are described with reference to FIGS. 10A–D. Specifically, within the alternative Marangoni drying system 81b, the second pair of substrate guide rails 135a–b are mounted to the side walls 129c and 129d of the dry chamber 87. Further, the door 141 is mounted to the top wall 129e of the dry chamber 87, and the additional substrate support 139 is mounted to the door 141. The dry chamber rotation stop 147 extends to a higher elevation (than that of FIGS. 9D–F), such that the dry chamber rotation stop 147 contacts the dry chamber 87 when the dry chamber 87 rotates to the horizontal position as shown in FIGS. 10C–D. Accordingly, in operation, after the substrate S is dry, and the movable substrate support 99c has exited the dry chamber 87, the dry chamber 87 rotates 90 degrees until the dry chamber 87 contacts, and is supported by, the dry chamber rotation stop 147. Thereafter the door hinge 143 is activated, and rotates, carrying the additional substrate support 139 out of contact with the substrate S. The horizontally oriented substrate S may now be extracted from the Marangoni drying system 81b via a horizontal substrate handler (not shown).

Accordingly, the inventive Marangoni drying systems 81a–b, when employed as the last cleaning module of the cleaning system 11 (FIGS. 1A–F) may eliminate the need for a separate output module. The alternative Marangoni drying system 81b of FIGS. 10A–D is particularly advantageous for drying 300 mm substrates, although other size substrates may also be dried thereby.

The foregoing description discloses only the preferred embodiments of the invention, modifications of the above disclosed apparatus and method which fall within the scope of the invention will be readily apparent to those of ordinary skill in the art. For instance, each substrate handler may individually index the vertical distance between the transport position and the handoff position, allowing the substrate supports to be positioned at varying elevations, and allowing individual substrates to receive varying processing (e.g., to pass over a given module without being processed therein). Likewise, a given module may have more than one substrate support. Particularly, for example, it may be advantageous to have two substrate supports within a megasonic tank, and to have a separate mechanism (e.g., a mechanism magnetically coupled through the chamber walls) for moving the substrate supports, such that the desired substrate support is positioned for substrate placement/extraction via the substrate transfer mechanism. Accordingly, processing within the megasonic tank may be twice as long as processing within the remaining modules. In another such aspect the same spacing may be maintained between the substrate supports of adjacent modules (e.g., between the input module's substrate support and the first substrate support within the megasonic tank, and between the second substrate support within the megasonic tank and the scrubber module's substrate support) and the wafer handlers which access the substrate supports within the megasonic tank may be motorized such that the grippers move horizontally so that the desired substrate support is accessed (e.g., if the two megasonic tank substrate supports are spaced a distance N, the grippers positioned thereabove would be spaced a distance X+N). Either such configuration may be employed within any of the respective modules such that the substrate supports and/or the grippers may be spaced variable distances and still achieve simultaneous wafer transfer from one module to the next.

Substrate orientation horizontal to vertical may occur outside the inventive cleaning system, thus the load/unload modules would not require rotation mechanisms. Similarly, flat finding may be performed outside the inventive cleaning system. The specific order and number of cleaning modules can vary, as can the relative positioning of the modules and the shape of the transfer mechanism (e.g., circular, rectangular, etc.). Finally, as used herein, a semiconductor substrate is intended to include both an unprocessed wafer and a processed wafer having patterned or unpatterned material layers formed thereon.

Within the inventive cleaning system the plurality of modules (megasonic tank, scrubbers, dryers, input/output, etc.) may support a substrate in a roughly vertical orientation. By supporting the disks at an angle which is not exactly 90 degrees from horizontal (i.e., roughly vertical), the substrates are in a known position which is much easier and more repeatably obtained, than is a perfectly vertical position. Although the exact angle may vary, a range of −10 to 10 degrees from normal is presently preferred and 88.5 degrees is presently most preferred. The wafer supports (e.g., the megasonic tank, scrubber, input/output rollers, the SRD gripper fingers and the substrate handler's pocket or clamp type grippers) each define a plane which is 88.5 degrees. This 88.5 degree plane is achieved by tilting each of the modules. Thus, each wafer plane is parallel to the walls of the module. Alternatively, just the supports may be tilted. Wafers are preferably lowered into each module from overhead where they are supported by grippers that also define a tilted plane (e.g., 88.5 degrees). The wafers are lifted and lowered with a normal (90 degree) motion, but the wafers themselves are tilted during transport.

Throughout the cleaning system the wafer is preferably tilted the same degree and the same direction. However, the degree and direction of the wafer's tilt may vary from module to module if desired, in which case the wafer transfer robot may be configured so as to adjust the degree and direction of the wafer tilt. In one aspect, a wafer is tilted toward its backside, as this orientation will provide better laminar airflow (which is generally provided from overhead) to the frontside of the wafer.

Accordingly, while the present invention has been disclosed in connection with the preferred embodiments thereof, it should be understood that other embodiments may fall within the spirit and scope of the invention, as defined by the following claims.

The invention claimed is:

1. An automated semiconductor substrate cleaning system comprising:
   a plurality of cleaning modules, each module having a substrate support for supporting a vertically oriented semiconductor substrate during a cleaning process, the plurality of modules being positioned such that the substrate supports are each spaced by a distance X from the substrate support of an adjacent one of the cleaning modules;
   an input module positioned adjacent a first end module of the plurality of cleaning modules, the input module having a substrate support positioned a distance X from a substrate support of the first end module;
   an output module positioned adjacent a second end module of the plurality of cleaning modules, the output module having a substrate support positioned a distance X from a substrate support of the second end module; and
   a semiconductor substrate transfer mechanism having a plurality of substrate handlers spaced a distance X, the transfer mechanism being above the plurality of cleaning modules and above the input and output modules and coupled so as to move forward and backward a distance X, thereby simultaneously carrying semiconductor substrates between adjacent ones of the input module, the cleaning modules and the output module.

2. The apparatus of claim 1 wherein each substrate support is positioned at about the same elevation, and with the same orientation, and wherein the substrate handlers are coupled horizontally and vertically, so as to allow the transfer mechanism to simultaneously transfer a plurality of semiconductor substrates between the substrate supports of adjacent modules, by indexing horizontally a distance X and vertically a distance Y.

3. The apparatus of claim 1 wherein each of the cleaning modules are approximately the same size.

4. The apparatus of claim 1 wherein the substrate handlers are fixedly coupled horizontally and wherein each substrate handler has an automatically adjustable vertical length portion.

5. The apparatus of claim 2 wherein the substrate handlers are removably coupled to the transfer mechanism, and wherein the input module, the cleaning modules and the output module are removably coupled via respective alignment and latching mechanisms, thereby allowing the automated substrate cleaning system to assume various configurations.

6. The apparatus of claim 2 wherein a first one of the modules comprises a sonic cleaning tank, and a second one of the modules comprises a scrubber.

7. The apparatus of claim 6 wherein a third one of the modules comprises a drier.

8. The apparatus of claim 6 wherein a third one of the modules comprises a spin-rinse-drier.

9. The apparatus of claim 2 wherein the input module comprises a mechanism for receiving a semiconductor substrate in a horizontal orientation and rotating the semiconductor substrate to a vertical orientation.

10. The apparatus of claim 9 wherein the output module comprises a mechanism for receiving a semiconductor substrate in a vertical orientation and rotating the semiconductor substrate to a horizontal orientation.

11. The apparatus of claim 1 wherein a first one of the plurality of cleaning modules comprises a sonic cleaning tank, and a second one of the plurality of cleaning modules comprises a scrubber.

12. The apparatus of claim 11 wherein the substrate handlers are removably coupled to the transfer mechanism, and wherein the input module, the cleaning modules and the output module are removably coupled via respective alignment and latching mechanisms, thereby allowing the automated substrate cleaning system to assume various configurations.

13. The apparatus of claim 2 further comprising a controller operatively coupled to the semiconductor substrate transfer mechanism, the controller comprising a program for moving the transfer mechanism from a load/hand off position in which one of the substrate handlers operatively couples the substrate support of the input module and the remaining wafer handlers each operatively couples the substrate support of one of the cleaning modules, to a transfer position in which the wafer handlers are above the input module and above the cleaning modules; for shifting the transfer mechanism a distance X such that each wafer handler is positioned above the substrate support of a cleaning module or of the output module; and
   for lowering the transfer mechanism to an unload/handoff position in which one of the substrate handlers operatively couples the substrate support of the output module and the remaining substrate handlers each operatively couple the substrate support of one of the cleaning modules.

14. The apparatus of claim 13 wherein:
   the input module further comprises a rotation mechanism adapted to receive a semiconductor substrate in a horizontal orientation and to rotate the semiconductor substrate to a vertical orientation;
   the output module further comprises a rotation mechanism adapted to receive a semiconductor substrate in a vertical orientation and to rotate the semiconductor substrate to a horizontal orientation;
   the controller is operatively coupled to the rotation mechanism of the input module and the rotation mechanism of the output module; and the controller program is programmed to change semiconductor substrate orientation at the input and the output modules, while the transfer mechanism is in the transfer position.

15. The apparatus of claim 1, wherein each of the cleaning modules includes a respective alignment and latching mechanism adapted to secure to at least one adjacent module.

16. An automated semiconductor substrate cleaning system comprising:

a plurality of cleaning modules, each module having a substrate support for supporting a vertically oriented semiconductor substrate during a cleaning process;

an input module positioned adjacent a first end module of the plurality of cleaning modules, the input module having a substrate support;

an output module positioned adjacent a second end module of the plurality of cleaning modules; and a semiconductor substrate transfer mechanism having a plurality of substrate handlers spaced apart, the transfer mechanism being movably coupled above the plurality of cleaning modules and above the input and output modules so as to move forward and backward, thereby simultaneously carrying semiconductor substrates between adjacent ones of the input module, the cleaning modules and the output module.

17. The apparatus of claim 16, wherein each of the cleaning modules includes a respective alignment and latching mechanism adapted to secure to at least one adjacent module.

* * * * *